US012751187B2

(12) United States Patent
Heo et al.

(10) Patent No.: US 12,751,187 B2

(45) Date of Patent: Sep. 29, 2026

(54) DISPLAY DEVICE AND ELECTRONIC DEVICE COMPRISING THE SAME

(71) Applicant: Samsung Display Co., LTD., Yongin-si (KR)

(72) Inventors: Na Ri Heo, Yongin-si (KR); Hyun Gue Song, Yongin-si (KR); Hee Seong Jeong, Yongin-si (KR); Sang Min Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 426 days.

(21) Appl. No.: 18/381,373

(22) Filed: Oct. 18, 2023

(65) Prior Publication Data

US 2024/0268200 A1 Aug. 8, 2024

(30) Foreign Application Priority Data

Feb. 3, 2023 (KR) ........................ 10-2023-0014706

(51) Int. Cl.

*H10K 59/80* (2023.01)
*H10K 59/122* (2023.01)

(52) U.S. Cl.

CPC ......... *H10K 59/879* (2023.02); *H10K 59/122* (2023.02); *H10K 59/873* (2023.02); *H10K 59/8792* (2023.02)

(58) Field of Classification Search

CPC . H10K 59/879; H10K 59/873; H10K 59/8731
See application file for complete search history.

(56) References Cited

U.S. PATENT DOCUMENTS

| | | | | |
|---|---|---|---|---|
| 10,896,939 | B2 | 1/2021 | Jeon et al. | |
| 2018/0083227 | A1* | 3/2018 | Ju | H10K 50/171 |
| 2022/0209204 | A1* | 6/2022 | Kim | H10K 59/8731 |
| 2022/0293890 | A1* | 9/2022 | Jeong | H10K 59/8792 |
| 2022/0416001 | A1* | 12/2022 | Kim | H04M 1/0266 |

FOREIGN PATENT DOCUMENTS

| | | |
|---|---|---|
| KR | 1020190136692 A | 12/2019 |
| KR | 1020220058720 | 5/2022 |
| KR | 1020220060071 A | 5/2022 |

* cited by examiner

*Primary Examiner* — Mariceli Santiago

(74) *Attorney, Agent, or Firm* — CANTOR COLBURN LLP

(57) ABSTRACT

A display device includes a pixel defining film on a substrate with openings in which light emitting elements are disposed, a capping layer on a common electrode of the light emitting elements, an auxiliary layer on the capping layer and including bismuth, a thin film encapsulation layer including first to third encapsulation layers, a light blocking layer disposed on the thin film encapsulation layer with opening holes overlapping the openings, and an antireflection layer on the light blocking layer. The first encapsulation layer includes first to third inorganic insulating layers including silicon oxynitride. The capping layer and the first to third inorganic insulating layers have different thicknesses or refractive indices from each other. A first opening interval between a first opening and a first opening hole overlapping the first opening is greater than a second opening interval between a second opening and a second opening hole overlapping the second opening.

15 Claims, 13 Drawing Sheets

DISPLAY DEVICE AND ELECTRONIC DEVICE COMPRISING THE SAME

This application claims priority to Korean Patent Application No. 10-2023-0014706, filed on Feb. 3, 2023, and all the benefits accruing therefrom under 35 U.S.C. § 119, the content of which in its entirety is herein incorporated by reference.

BACKGROUND

1. Field

The disclosure relates to a display device and an electronic device including the display device.

2. Description of the Related Art

As an information society develops, the demand for a display device for displaying an image is increasing in various forms. For example, the display device has been applied to various electronic devices such as smartphones, digital cameras, laptop computers, navigation devices, and smart televisions. The display devices may be flat panel display devices such as liquid crystal display devices, field emission display devices, or organic light emitting display devices. Among the flat panel display devices, the light emitting display device may include a light emitting element in which each of the pixels of a display panel may emit light by itself, thereby displaying an image without a backlight unit providing the light to the display panel.

SUMMARY

Embodiments of the disclosure provide a display device having improved light efficiency and viewing angle characteristics by including a stacked structure in which a plurality of inorganic insulating layers are disposed, and an electronic device including the display device.

However, embodiments of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device includes a pixel defining film disposed on a substrate, where a plurality of openings is defined through the pixel defining film, plurality of light emitting elements disposed in the openings, respectively, where the light emitting elements emit light of different colors from each other, a capping layer disposed on a common electrode of the light emitting element, an auxiliary layer disposed on the capping layer and including bismuth, a thin film encapsulation layer including a first encapsulation layer disposed on the auxiliary layer, a second encapsulation layer disposed on the first encapsulation layer, and a third encapsulation layer disposed on the second encapsulation layer, a light blocking layer disposed on the thin film encapsulation layer, where a plurality of opening holes is defined through the light blocking layer to overlap the openings, respectively, and an antireflection layer disposed on the light blocking layer. In such an embodiment, the first encapsulation layer includes a first inorganic insulating layer disposed on the auxiliary layer and including silicon oxynitride, a second inorganic insulating layer disposed on the first inorganic insulating layer and including silicon oxynitride, and a third inorganic insulating layer disposed on the second inorganic insulating layer and including silicon oxynitride, the capping layer has a thickness in a range of about 200 angstrom (Å) to about 300 Å, the auxiliary layer has a thickness in a range of about 80 Å to about 100 Å, the first inorganic insulating layer has a thickness in a range of about 1700 Å to about 1800 Å, the second inorganic insulating layer has a thickness in a range of about 1100 Å to about 1200 Å, and the third inorganic insulating layer has a thickness of about 4000 Å or greater. In such an embodiment, a first opening interval between a first opening of the openings, in which a first light emitting element of the light emitting elements which emits light of a first color is disposed, and a first opening hole of the opening holes overlapping the first opening is greater than a second opening interval between a second opening, in which a second light emitting element of the light emitting elements which emits light of a second color different from the first color is disposed, and a second opening hole of the opening holes overlapping the second opening.

In an embodiment, The first inorganic insulating layer may be disposed directly on the auxiliary layer.

In an embodiment, the auxiliary layer may have a refractive index greater than a refractive index of the capping layer, the first inorganic insulating layer may have a refractive index greater than the refractive index of the auxiliary layer, the second inorganic insulating layer may have a refractive index smaller than the refractive index of the first inorganic insulating layer, and the third inorganic insulating layer may have a refractive index greater than the refractive index of the second inorganic insulating layer.

In an embodiment, the refractive index of the capping layer may be in a range of about 1.60 to about 2.30, the refractive index of the auxiliary layer may be about 2.0 or greater and greater than the refractive index of the capping layer, the refractive index of the first inorganic insulating layer may be a range of about 1.70 to about 2.0, the refractive index of the second inorganic insulating layer may be in a range of about 1.20 to about 1.62, and the refractive index of the third inorganic insulating layer may be in a range of 1.48 to 1.89 and greater than the refractive index of the second inorganic insulating layer.

In an embodiment, the refractive index of the first inorganic insulating layer may be about 1.89, the refractive index of the second inorganic insulating layer may be about 1.48, and the refractive index of the third inorganic insulating layer may be about 1.77.

In an embodiment, the common electrode of the light emitting element may have a thickness of about 130 Å, the thickness of the capping layer may be about 250 Å, the thickness of the auxiliary layer may be about 95 Å, the thickness of the first inorganic insulating layer may be about 1700 Å, the thickness of the second inorganic insulating layer may be about 1300 Å, and the thickness of the third inorganic insulating layer may be about 7000 Å.

In an embodiment, the common electrode of the light emitting element may have a thickness of about 130 Å, the thickness of the capping layer may be about 200 Å, the thickness of the auxiliary layer may be about 95 Å, the thickness of the first inorganic insulating layer may be about 1700 Å, the thickness of the second inorganic insulating layer may be about 1300 Å, and the thickness of the third inorganic insulating layer may be about 7000 Å.

In an embodiment, the common electrode of the light emitting element may have a thickness of about 130 Å, the thickness of the capping layer may be about 250 Å, the thickness of the auxiliary layer may be about 95 Å, the thickness of the first inorganic insulating layer may be about 1600 Å, the thickness of the second inorganic insulating layer may be about 1300 Å, and the thickness of the third inorganic insulating layer may be about 7000 Å.

In an embodiment, the first encapsulation layer may further include a fourth inorganic insulating layer disposed on the third inorganic insulating layer, and a fifth inorganic insulating layer disposed on the fourth inorganic insulating layer, and the fourth inorganic insulating layer may include silicon oxynitride and has a thickness in a range of about 300 Å to about 1000 Å.

In an embodiment, the first opening interval may be about 5.72 micrometers (μm), and the second opening interval may be about 4.72 μm.

In an embodiment, the first opening interval may be about 5.72 μm, and the second opening interval may be about 3.72 μm.

In an embodiment, the antireflection layer may have a thickness of about 2 μm or greater.

According to an embodiment of the disclosure, a display device includes a pixel defining film disposed on a substrate, where a plurality of openings is defined through the pixel defining film, a plurality of light emitting elements disposed in the openings, respectively, where the light emitting elements emit light of different colors from each other, a capping layer disposed on a common electrode of the light emitting elements, an auxiliary layer disposed on the capping layer and including bismuth, a thin film encapsulation layer including a first encapsulation layer disposed on the auxiliary layer, a second encapsulation layer disposed on the first encapsulation layer, and a third encapsulation layer disposed on the second encapsulation layer, a light blocking layer disposed on the thin film encapsulation layer, where a plurality of opening holes is defined through the light blocking layer to overlap the openings, respectively, and an antireflection layer disposed on the light blocking layer. In such an embodiment, the first encapsulation layer includes a first inorganic insulating layer disposed on the auxiliary layer and including silicon oxynitride, a second inorganic insulating layer disposed on the first inorganic insulating layer and including silicon oxynitride, and a third inorganic insulating layer disposed on the second inorganic insulating layer and including silicon oxynitride, the capping layer has a refractive index in a range of about 1.60 to about 2.30, the auxiliary layer has a refractive index which is about 2.0 or greater and greater than the refractive index of the capping layer, the first inorganic insulating layer has a refractive index in a range of about 1.70 to about 2.0, the second inorganic insulating layer has a refractive index in a range of about 1.20 to about 1.62, and the third inorganic insulating layer has a refractive index that is in a range of about 1.48 to about 1.89, and greater than the refractive index of the second inorganic insulating layer. In such an embodiment, a first opening interval between a first opening of the openings, in which a first light emitting element of the light emitting elements which emits light of a first color is disposed, and a first opening hole of the openings holes overlapping the first opening is greater than a second opening interval between a second opening of the openings, in which a second light emitting element of the light emitting elements which emits light of a second color different from the first color is disposed, and a second opening hole of the opening holes overlapping the second opening.

In an embodiment, the refractive index of the capping layer may be about 2.0, the refractive index of the auxiliary layer may be about 2.1, the refractive index of the first inorganic insulating layer may be about 1.89, the refractive index of the second inorganic insulating layer may be about 1.48, and the refractive index of the third inorganic insulating layer may be about 1.77.

In an embodiment, the refractive index of the capping layer may be about 1.97, the refractive index of the first inorganic insulating layer may be about 1.89, and the refractive index of the second inorganic insulating layer may be about 1.48.

In an embodiment, The capping layer may have a thickness in a range of about 200 Å to about 300 Å, the auxiliary layer may have a thickness in a range of about 80 Å to about 100 Å, the first inorganic insulating layer may have a thickness in a range of about 1700 Å to about 1800 Å, the second inorganic insulating layer may have a thickness in a range of about 1100 Å to about 1200 Å, and the third inorganic insulating layer may have a thickness of about 4000 Å or greater, and the antireflection layer may have a thickness of about 2 μm or greater.

In an embodiment, the first opening interval may be about 5.72 μm, and the second opening interval may be about 4.72 μm or less.

According to an embodiment of the disclosure, an electronic device includes a display device including a display area and a non-display area surrounding the display area, and an optical device disposed to overlap a portion of the display area of the display device. In such an embodiment, the display device includes a pixel defining film disposed on a substrate, where a plurality of openings is defined through the pixel defining film, a plurality of light emitting elements disposed in the openings, respectively, where the light emitting elements emit light of different colors from each other, a capping layer disposed on a common electrode of the light emitting element, an auxiliary layer disposed on the capping layer and including bismuth, a thin film encapsulation layer including a first encapsulation layer disposed on the auxiliary layer, a second encapsulation layer disposed on the first encapsulation layer, and a third encapsulation layer disposed on the second encapsulation layer, a light blocking layer disposed on the thin film encapsulation layer, where a plurality of opening holes is defined through the light blocking layer to overlap the openings, respectively, and an antireflection layer disposed on the light blocking layer. In such an embodiment, the first encapsulation layer includes a first inorganic insulating layer disposed on the auxiliary layer and including silicon oxynitride, a second inorganic insulating layer disposed on the first inorganic insulating layer and including silicon oxynitride, and a third inorganic insulating layer disposed on the second inorganic insulating layer and including silicon oxynitride. In such an embodiment, the capping layer has a thickness in a range of about 200 Å to about 300 Å, the auxiliary layer has a thickness in a range of about 80 Å to about 100 Å, the first inorganic insulating layer has a thickness in a range of about 1700 Å to about 1800 Å, the second inorganic insulating layer has a thickness in a range of about 1100 Å to about 1200 Å, the third inorganic insulating layer has a thickness of about 4000 Å or greater. In such an embodiment, a first opening interval between a first opening of the openings, in which a first light emitting element of the light emitting elements which emits light of a first color is disposed, and a first opening hole of the opening holes overlapping the first opening is greater than a second opening interval between a second opening of the openings, in which a second light emitting element of the light emitting elements which emits light of a second color different from the first color is disposed, and a second opening hole of the opening holes overlapping the second opening.

In an embodiment, the capping layer may have a refractive index in a range of about 1.60 to about 2.30, the auxiliary layer may have a refractive index which is about 2.0 or greater and greater than the refractive index of the capping layer, the first inorganic insulating layer may have a refractive index in a range of about 1.70 to about 2.0, the second inorganic insulating layer may have a refractive index in a range of about 1.20 to about 1.62, and the third inorganic insulating layer may have a refractive index in a range of about 1.48 to about 1.89 and greater than the refractive index of the second inorganic insulating layer.

In an embodiment, the first opening interval may be about 5.72 μm, and the second opening interval may be about 4.72 μm or less.

In an embodiment, the display device according to embodiments may include a stacked structure of layers having different refractive indices from each other, thereby effectively controlling viewing angle characteristics of the display device as desired.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other features of the disclosure will become more apparent by describing in detail embodiments thereof with reference to the accompanying drawings, in which.

DETAILED DESCRIPTION

Figure 1:
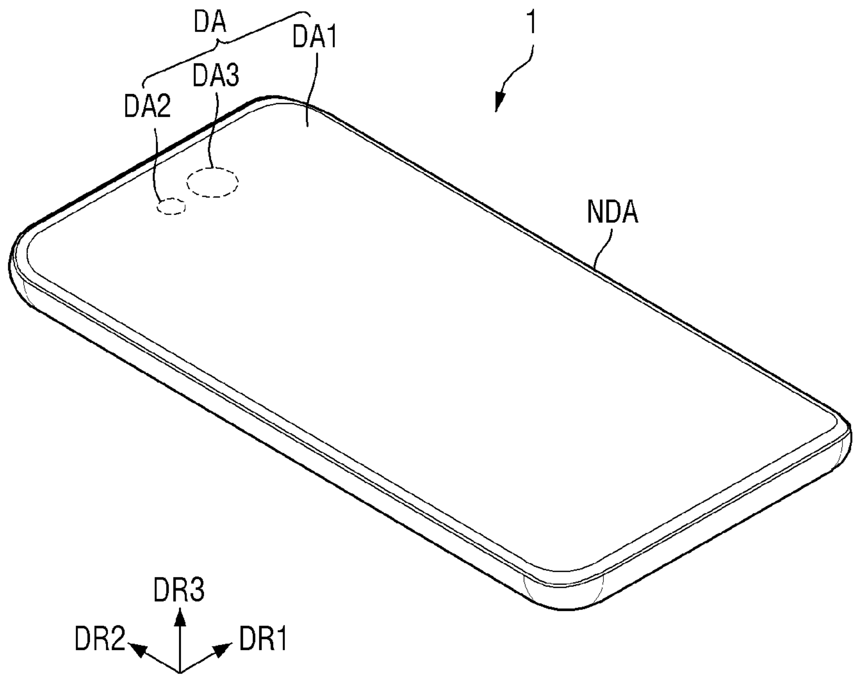
FIG. 1 is a schematic perspective view of an electronic device according to an embodiment.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present therebetween. In contrast, when an element is referred to as being "directly on" another element, there are no intervening elements present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

FIG. 1 is a schematic plan view of an electronic device according to an embodiment.

Referring to FIG. 1, an embodiment of an electronic device 1 displays a moving image or a still image. The electronic device 1 may refer to any electronic device that provides a display screen. In an embodiment, for example, the electronic device 1 may include televisions, laptop computers, monitors, billboards, Internet of things (IoT), mobile phones, smartphones, tablet personal computers (PCs), electronic watches, smartwatches, watch phones, head mounted displays, mobile communication terminals, electronic notebooks, electronic books, portable multimedia players (PMPs), navigation, game consoles, digital cameras, camcorders, and or like that provide the display screen.

The electronic device 1 may include a display device (‘10’ in FIG. 2) that provides a display screen. Examples of the display device may include an inorganic light emitting diode display device, an organic light emitting display device, a quantum dot light emitting display device, a plasma display device, and a field emission display device. Hereinafter, it is illustrated that an organic light emitting diode display device is used as an example of the display device, but the disclosure is not limited thereto, and may also be applied to other display devices as long as the same technical idea is applicable.

In an embodiment, a shape of the electronic device 1 may be variously changed or modified. In an embodiment, for example, the electronic device 1 may have a shape such as a rectangle with a long width, a rectangle with a long length, a square, a quadrangle with rounded corners (vertices), other polygons, or a circle. A shape of a display area DA of the electronic device 1 may also be similar to an overall shape of the electronic device 1. In FIG. 1, an embodiment of an electronic device 1 having a rectangular shape with a long length in a second direction DR2 is illustrated.

The electronic device 1 may include a display area DA and a non-display area NDA. The display area DA is an area in which a screen may be displayed, and the non-display area NDA is an area in which a screen is not displayed. The display area DA may also be referred to as an active area, and the non-display area NDA may also be referred to as a non-active area. The display area DA may generally occupy a center of the display device 1.

The display area DA may include a first display area DA1, a second display area DA2, and a third display area DA3. The second display area DA2 and the third display area DA3, which are areas in which components for adding various functions to the electronic device 1 are disposed, may correspond to component areas.

Figure 2:
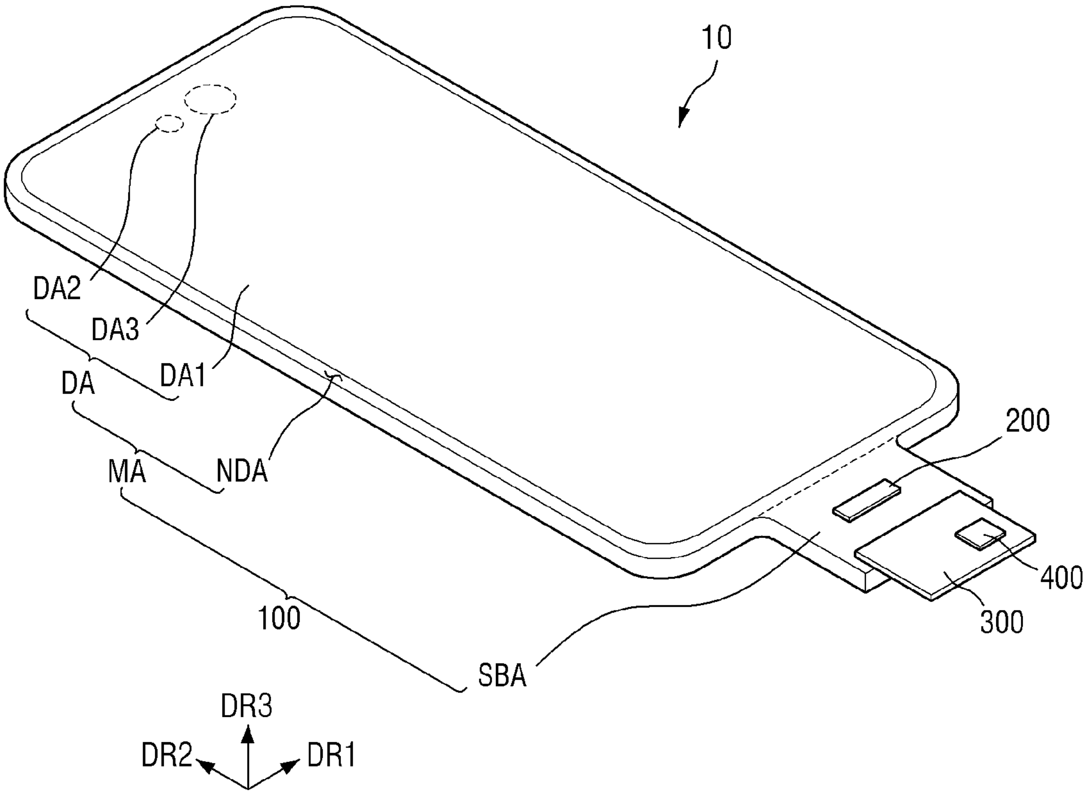
FIG. 2 is a perspective view illustrating a display device included in the electronic device according to an embodiment.

FIG. 2 is a perspective view illustrating a display device included in the electronic device according to an embodiment.

Referring to FIG. 2, the electronic device 1 according to an embodiment may include a display device 10. The display device 10 may provide a screen displayed by the electronic device 1. The display device 10 may have a planar shape similar to that of the electronic device 1. In an embodiment, for example, the display device 10 may have a shape similar to a rectangle having a short side in a first direction DR1 and a long side in a second direction DR2. A third direction DR3 may be a direction perpendicular to the first and second directions DR1 and DR2 or a thickness direction of the display device 10. A corner where the short side in the first direction DR1 and the long side in the second direction DR2 meet may be rounded to have a curvature, but is not limited thereto and may also be formed at a right angle. The planar shape of the display device 10 is not limited to the quadrangle, and may be formed similarly to other polygons, circles, or ovals.

The display device 10 may include a display panel 100, a display driving unit 200, a circuit board 300, and a touch driving unit 400.

The display panel 100 may include a main area MA and a sub-area SBA.

The main area MA may include a display area DA including pixels for displaying an image, and a non-display area NDA disposed around the display area DA. The display area DA may include a first display area DA1, a second display area DA2, and a third display area DA3. The display area DA may emit light from a plurality of light emitting areas or a plurality of opening areas. In an embodiment, for example, the display panel 100 may include a pixel circuit including switching elements, a pixel defining film defining the light emitting areas or the opening areas, and a self-light emitting element.

In an embodiment, for example, the self-light emitting element may include at least one of an organic light emitting diode (LED) including an organic light emitting layer, a quantum dot LED including a quantum dot light emitting layer, an inorganic LED including an inorganic semiconductor, and a micro LED, but is not limited thereto.

The non-display area NDA may be an area outside the display area DA. The non-display area NDA may be defined as an edge area of the main area MA of the display panel 100. The non-display area NDA may include a gate driving unit (not illustrated) supplying gate signals to gate lines, and fan-out lines (not illustrated) connecting the display driving unit 200 and the display area DA.

The sub-area SBA may be an area extending from one side of the main area MA. The sub-area SBA may include a flexible material that may be bent, folded, rolled, or the like. In an embodiment, for example, when the sub-area SBA is bent, the sub-area SBA may overlap the main area MA in a thickness direction (or the third direction DR3). The sub-area SBA may include the display driving unit 200 and a pad portion connected to a circuit board 300. In an alternative embodiment, the sub-area SBA may be omitted, and the display driving unit 200 and the pad portion may be disposed in the non-display area NDA.

The display driving unit 200 may output signals and voltages for driving the display panel 100. The display driving unit 200 may supply data voltages to the data lines. The display driving unit 200 may supply a power voltage to the power line and may supply a gate control signal to the gate driving unit. The display driving unit 200 may be formed as an integrated circuit (IC) and mounted on the display panel 100 by a chip on glass (COG) method, a chip on plastic (COP) method, or an ultrasonic bonding method. In an embodiment, for example, the display driving unit 200 may be disposed in the sub-area SBA, and may overlap the main area MA in the thickness direction by bending of the sub-area SBA. In an alternative embodiment, for example, the display driving unit 200 may be mounted on the circuit board 300.

The circuit board 300 may be attached onto the pad portion of the display panel 100 using an anisotropic conductive film (ACF). Lead lines of the circuit board 300 may be electrically connected to the pad portion of the display panel 100. The circuit board 300 may be a flexible film such as a flexible printed circuit board, a printed circuit board, or a chip on film.

The touch driving unit 400 may be mounted on the circuit board 300. The touch driving unit 400 may be connected to a touch sensing unit of the display panel 100. The touch driving unit 400 may supply a touch driving signal to a plurality of touch electrodes of the touch sensing unit, and may sense an amount of change in capacitance between the plurality of touch electrodes. In an embodiment, for example, the touch driving signal may be a pulse signal having a predetermined frequency. The touch driving unit 400 may calculate whether an input is made and input coordinates based on the amount of change in capacitance between the plurality of touch electrodes. The touch driving unit 400 may be formed as an IC.

Figure 3:
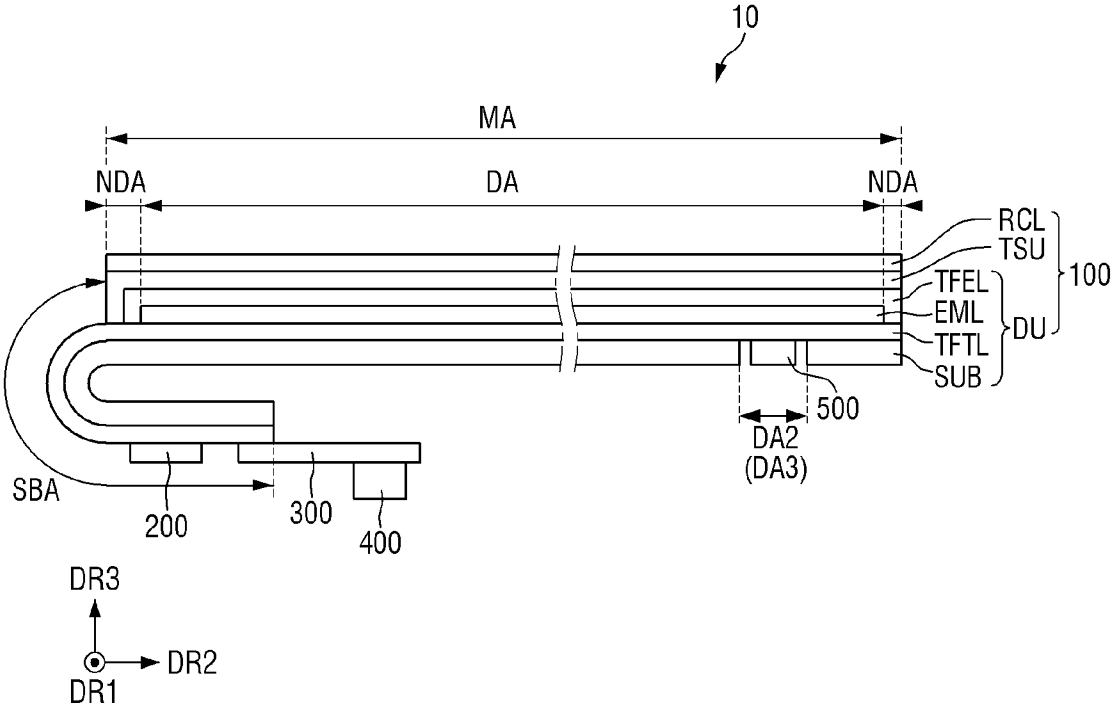
FIG. 3 is a cross-sectional view of the display device of FIG. 2 viewed from a side surface.

FIG. 3 is a cross-sectional view of the display device of FIG. 2 viewed from a side surface.

Referring to FIG. 3, an embodiment of the display panel 100 may include a display layer DU, a touch sensing layer TSU, and an antireflection layer RCL. The display layer DU may include a substrate SUB, a thin film transistor layer TFTL, a light emitting element layer EML, and a thin film encapsulation layer TFEL.

The substrate SUB may be a base substrate or a base member. The substrate SUB may be a flexible substrate that may be bent, folded, rolled, or the like. In an embodiment, for example, the substrate SUB may include a polymer resin such as polyimide (PI), but is not limited thereto. In an alternative embodiment, the substrate SUB may include a glass material or a metal material.

The thin film transistor layer TFTL may be disposed on the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines connecting the display driving unit 200 and the data lines, and lead lines connecting the display driving unit 200 and the pad portion. Each of the thin film transistors may include a semiconductor area, a source electrode, a drain electrode, and a gate electrode. In an embodiment, for example, where the gate driving unit is provided or formed on one side of the non-display area NDA of the display panel 100, the gate driving unit may include the thin film transistors.

The thin film transistor layer TFTL may be disposed in the display area DA, the non-display area NDA, and the sub-area SBA. The thin film transistors, the gate lines, the data lines, and the power lines of each of the pixels of the thin film transistor layer TFTL may be disposed in the display area DA. The gate control lines and the fan-out lines of the thin film transistor layer TFTL may be disposed in the non-display area NDA. The lead lines of the thin film transistor layer TFTL may be disposed in the sub-area SBA.

The light emitting element layer EML may be disposed on the thin film transistor layer TFTL. The light emitting element layer EML may include a plurality of light emitting elements including a first electrode, a second electrode, and a light emitting layer to emit light, and a pixel defining film defining pixels. The plurality of light emitting elements of the light emitting element layer EML may be disposed in the display area DA.

In an embodiment, the light emitting layer may be an organic light emitting layer including an organic material. The light emitting layer may include a hole transporting layer, an organic light emitting layer, and an electron transporting layer. When the first electrode receives a voltage through the thin film transistor of the thin film transistor layer TFTL and the second electrode receives a cathode voltage, holes and electrons may move to the organic light emitting layer through the hole transporting layer and the electron transporting layer, respectively, and may be combined with each other in the organic light emitting layer to emit light.

In an alternative embodiment, the light emitting element may include a quantum dot LED including a quantum dot light emitting layer, an inorganic LED including an inorganic semiconductor, or a micro LED.

The thin film encapsulation layer TFEL may cover an upper surface and side surfaces of the light emitting element layer EML, and may protect the light emitting element layer EML. The thin film encapsulation layer TFEL may include at least one inorganic film and at least one organic film for encapsulating the light emitting element layer EML.

The touch sensing layer TSU may be disposed on the thin film encapsulation layer TFEL. The touch sensing layer TSU may include a plurality of touch electrodes for detecting a user's touch in a capacitance method, and touch lines connecting the plurality of touch electrodes and the touch driving unit 400. In an embodiment, for example, the touch sensing layer TSU may sense the user's touch in a mutual capacitance method or a self-capacitance method.

In an alternative embodiment, the touch sensing layer TSU may be disposed on a separate substrate disposed on the display layer DU. In such an embodiment, the substrate supporting the touch sensing layer TSU may be a base member that encapsulates the display layer DU.

The plurality of touch electrodes of the touch sensing layer TSU may be disposed in a touch sensor area overlapping the display area DA. The touch lines of the touch sensing layer TSU may be disposed in a touch peripheral area overlapping the non-display area NDA.

The antireflection layer RCL may be disposed on the touch sensing layer TSU. The antireflection layer RCL may absorb a portion of light introduced from the outside of the display device 10 to reduce reflected light caused by external light. Therefore, the antireflection layer RCL may prevent distortion in color caused by reflection of external light.

As the antireflection layer RCL is directly disposed or formed on the touch sensing layer TSU, the display device 10 may not include a separate substrate for the antireflection layer RCL. Therefore, a thickness of the display device 10 may be relatively small or have a relatively thin thickness.

In some embodiments, the display device 10 may further include an optical device 500. The optical device 500 may be disposed in the second display area DA2 or the third display area DA3. The optical device 500 may emit or receive light in infrared, ultraviolet, and visible light bands. In an embodiment, for example, the optical device 500 may be an optical sensor that detects light incident on the display device 10, such as a proximity sensor, an illuminance sensor, and a camera sensor or an image sensor.

Figure 4:
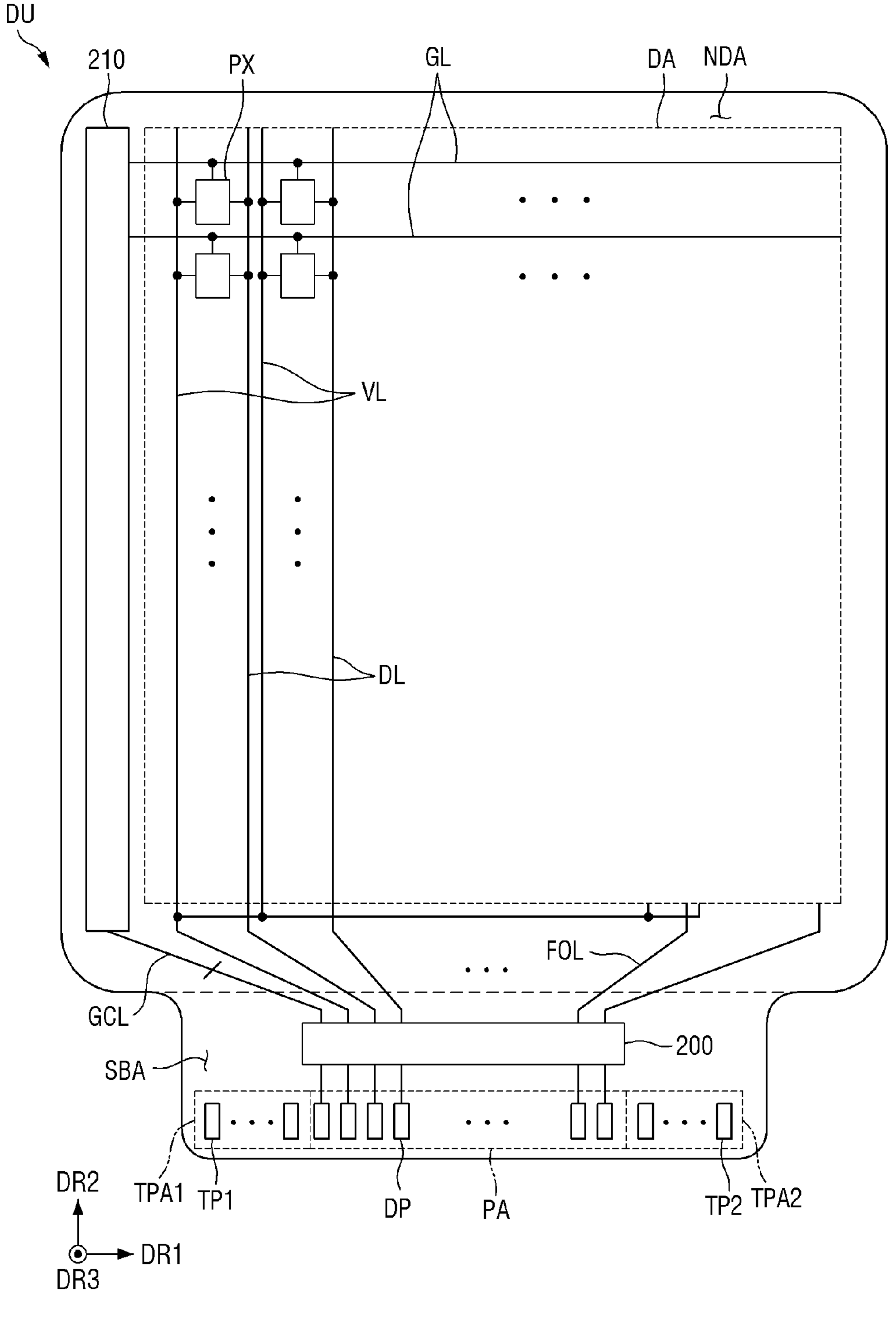
FIG. 4 is a plan view illustrating a display layer of the display device according to an embodiment.

FIG. 4 is a plan view illustrating a display layer of the display device according to an embodiment.

Referring to FIG. 4, in an embodiment, the display layer DU may include a display area DA and a non-display area NDA.

The display area DA may be disposed at a center of the display panel 100. A plurality of pixels PX, a plurality of gate lines GL, a plurality of data lines DL, and a plurality of power lines VL may be disposed in the display area DA. Each of the plurality of pixels PX may be defined as a minimum or basic unit for emitting light.

The plurality of gate lines GL may supply a gate signal received from a gate driving unit 210 to the plurality of pixels PX. The plurality of gate lines GL may extend in the first direction DR1 and may be spaced apart from each other in the second direction DR2 intersecting the first direction DR1.

The plurality of data lines DL may supply the data voltage received from the display driving unit 200 to the plurality of pixels PX. The plurality of data lines DL may extend in the second direction DR2 and may be spaced apart from each other in the first direction DR1.

The plurality of power lines VL may supply the power voltage received from the display driving unit 200 to the plurality of pixels PX. Here, the power voltage may be at least one of a driving voltage, an initialization voltage, a reference voltage, and a low potential voltage. The plurality of power lines VL may extend in the second direction DR2 and may be spaced apart from each other in the first direction DR1.

The non-display area NDA may surround the display area DA. A gate driving unit 210, fan-out lines FOL, and a gate control line GCL may be disposed in the non-display area NDA. The gate driving unit 210 may generate a plurality of gate signals based on the gate control signal, and may sequentially supply the plurality of gate signals to the plurality of gate lines GL according to a set order.

The fan-out lines FOL may extend from the display driving unit 200 to the display area DA. The fan-out lines FOL may supply the data voltages received from the display driving unit 200 to the plurality of data lines DL.

The gate control line GCL may extend from the display driving unit 200 to the gate driving unit 210. The gate control line GCL may supply the gate control signal received from the display driving unit 200 to the gate driving unit 210.

The sub-area SBA may include a display driving unit 200, a pad area PA, and first and second touch pad areas TPA1 and TPA2.

The display driving unit 200 may output signals and voltages for driving the display panel 100 to the fan-out lines FOL. The display driving unit 200 may supply the data voltage to the data lines DL through the fan-out lines FOL. The data voltage may be supplied to the plurality of pixels PX and may control luminance of the plurality of pixels PX. The display driving unit 200 may supply the gate control signal to the gate driving unit 210 through the gate control line GCL.

The pad area PA, the first touch pad area TPA1, and the second touch pad area TPA2 may be disposed at an edge of the sub-area SBA. The pad area PA, the first touch pad area TPA1, and the second touch pad area TPA2 may be electrically connected to the circuit board 300 using an anisotropic conductive film or a material such as a self assembly anisotropic conductive paste SAP.

The pad area PA may include a plurality of display pad portions DP. The plurality of display pad portions DP may be connected to a graphic system through the circuit board 300. The plurality of display pad portions DP may be connected to the circuit board 300 to receive digital video data, and may supply the digital video data to the display driving unit 200.

Figure 5:
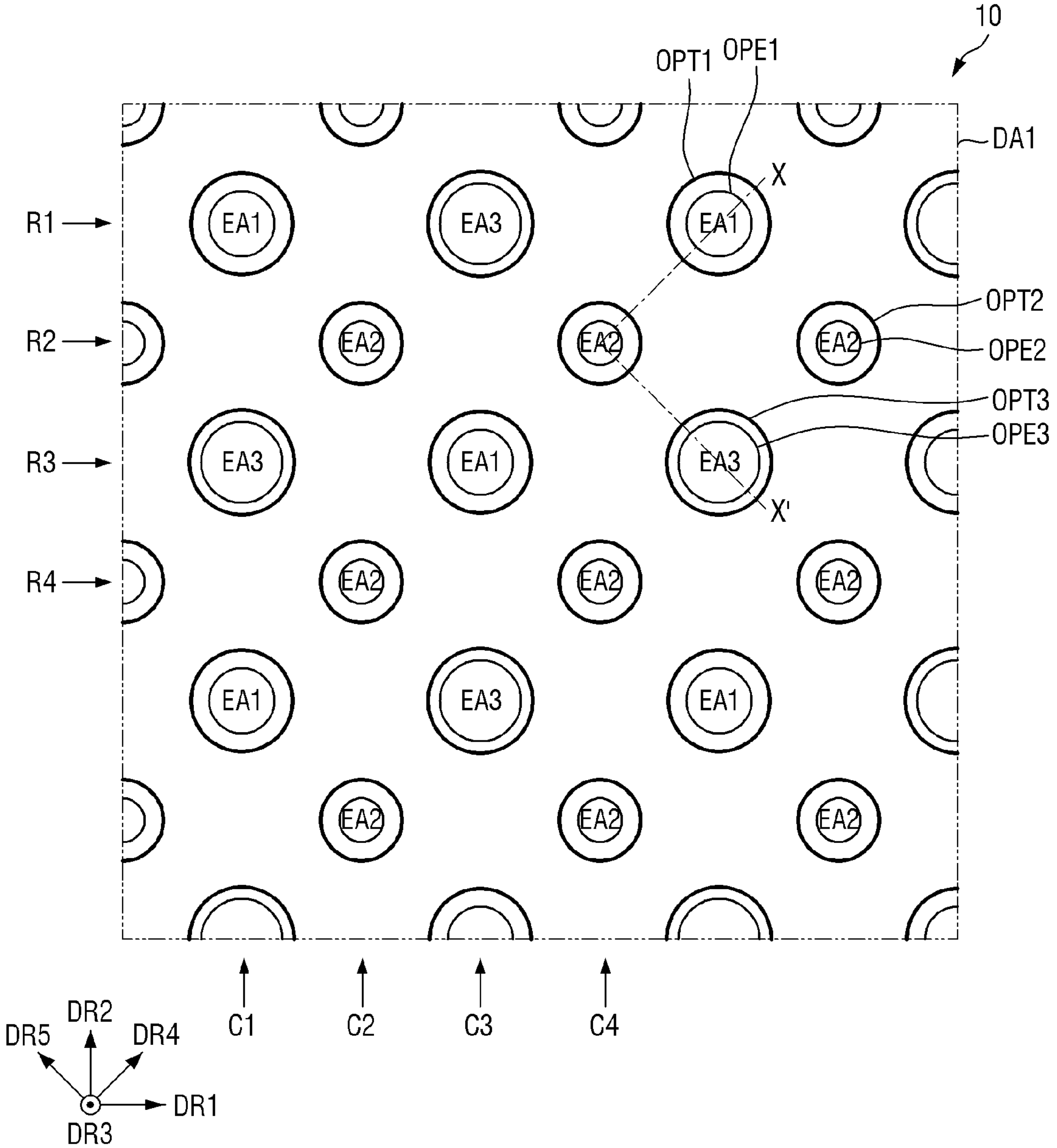
FIG. 5 is a plan view illustrating a display area of the display device according to an embodiment.
Figure 6:
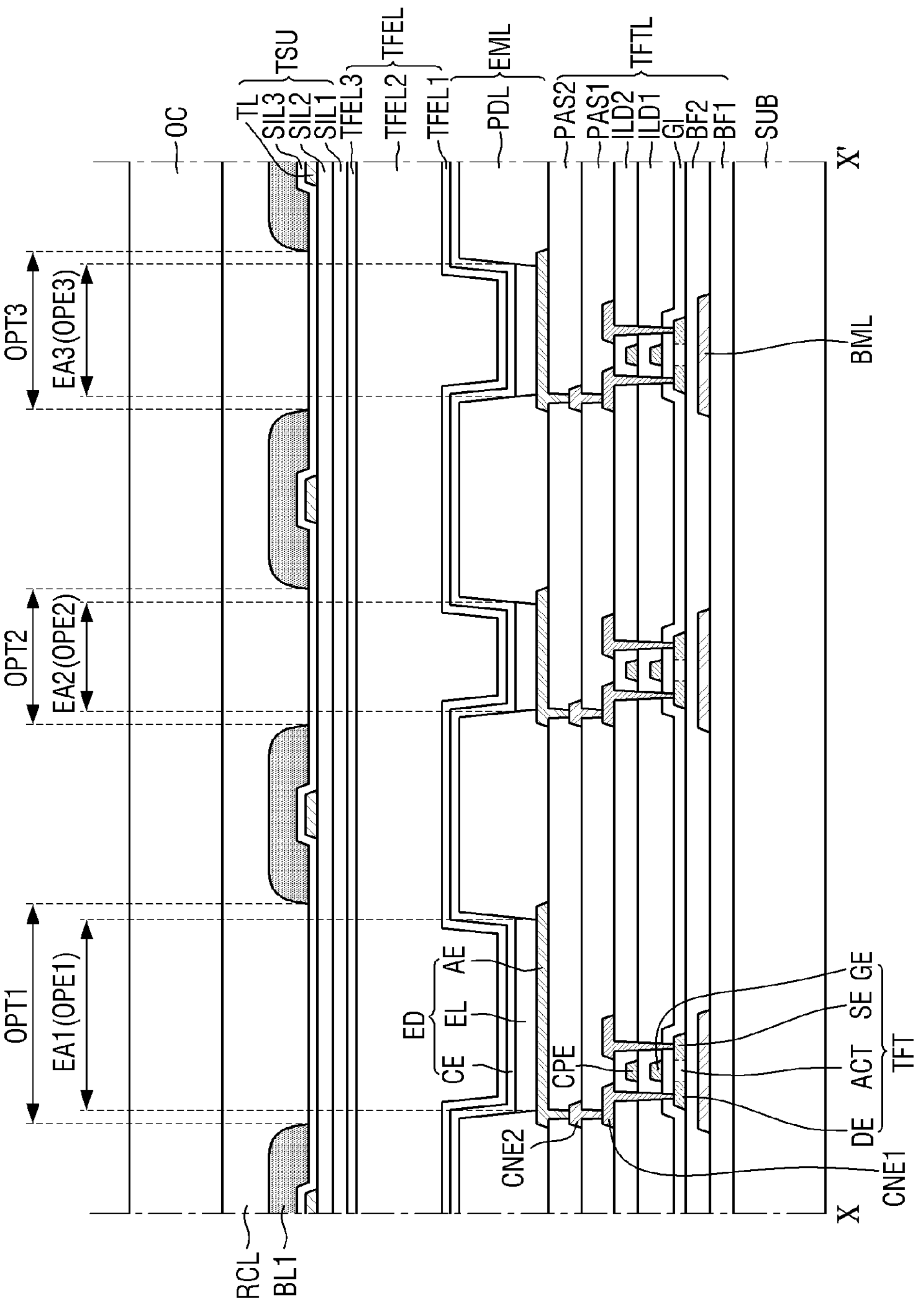
FIG. 6 is a cross-sectional view taken along line X-X' of FIG. 5, illustrating a portion of the display device according to an embodiment.

FIG. 5 is a plan view illustrating a display area of the display device according to an embodiment. FIG. 6 is a cross-sectional view taken along line X-X' of FIG. 5, illustrating a portion of the display device according to an embodiment. FIG. 6 is a partial cross-sectional view of the display device 10 and illustrates cross-sections of the substrate SUB, the thin film transistor layer TFTL, the light emitting element layer EML, the thin film encapsulation layer TFEL, and the touch sensing layer TSU of the display layer DU.

Referring of FIGS. 5 and 6, in an embodiment, the substrate SUB may be a base substrate or a base member. The substrate SUB may be a flexible substrate that may be bent, folded, rolled, or the like. In an embodiment, for example, the substrate SUB may include a polymer resin such as polyimide (PI), but is not limited thereto. In an alternative embodiment, for example, the substrate SUB may include a glass material or a metal material.

The thin film transistor layer TFTL may include a first buffer layer BF1, a lower metal layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic film capable of preventing permeation of air or moisture. In an embodiment, for example, the first buffer layer BF1 may include a plurality of stacked inorganic films.

The lower metal layer BML may be disposed on the first buffer layer BF1. In an embodiment, for example, the lower metal layer BML may be formed as a single layer or multiple layers including at least one selected from molybdenum (Mo), aluminum (Al), chromium (Cr), gold (Au), titanium (Ti), nickel (Ni), neodymium (Nd), and copper (Cu), and an alloy thereof.

The second buffer layer BF2 may cover the first buffer layer BF1 and the lower metal layer BML. The second buffer layer BF2 may include an inorganic film capable of preventing permeation of air or moisture. In an embodiment, for example, the second buffer layer BF2 may include a plurality of stacked inorganic films.

The thin film transistor TFT may be disposed on the second buffer layer BF2, and may constitute a pixel circuit of each of the plurality of pixels. In an embodiment, for example, the thin film transistor TFT may be a driving transistor or a switching transistor of the pixel circuit. The thin film transistor TFT may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in the thickness direction, and may be insulated from the gate electrode GE by the gate insulating layer GI. In a portion of the semiconductor layer ACT, a material of the semiconductor layer ACT may become a conductor to form the source electrode SE and the drain electrode DE.

The gate electrode GE may be disposed on the gate insulating layer GI. The gate electrode GE may overlap the semiconductor layer ACT with the gate insulating layer GI interposed therebetween.

The gate insulating layer GI may be disposed on the semiconductor layer ACT. In an embodiment, for example, the gate insulating layer GI may cover the semiconductor layer ACT and the second buffer layer BF2, and may insulate the semiconductor layer ACT and the gate electrode GE from each other. The gate insulating layer GI may be provided with a contact hole defined therein, through which the first connection electrode CNE1 is disposed.

The first interlayer insulating layer ILD1 may cover the gate electrode GE and the gate insulating layer GI. The first interlayer insulating layer ILD1 may be provided with a contact hole defined therein through which the first connection electrode CNE1 is disposed. The contact hole of the first interlayer insulating layer ILD1 may be connected to the contact hole of the gate insulating layer GI and a contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may be provided with a contact hole defined therein through which the first connection electrode CNE1 is disposed. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the thin film transistor TFT and the second connection electrode CNE2 to each other. The first connection electrode CNE1 may be inserted into the contact holes formed in the second interlayer insulating layer ILD2, the first interlayer insulating layer ILD1, and the gate insulating layer GI to be in contact with the drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may be provided with a contact hole defined therein through which the second connection electrode CNE2 is disposed.

The second connection electrode CNE2 may be disposed on the first passivation layer PAS1. The second connection electrode CNE2 may electrically connect the first connection electrode CNE1 and a pixel electrode AE of a light emitting element ED to each other. The second connection electrode CNE2 may be inserted into the contact hole formed in the first passivation layer PAS1 to be in contact with the first connection electrode CNE1.

The second passivation layer PAS2 may cover the second connection electrode CNE2 and the first passivation layer PAS1. The second passivation layer PAS2 may be provided with a contact hole defined therein, through which the pixel electrode AE of the light emitting element ED is disposed.

The light emitting element layer EML may be disposed on the thin film transistor layer TFTL. The light emitting element layer EML may include light emitting elements ED and a pixel defining film PDL. The light emitting element ED may include a pixel electrode AE, a light emitting layer EL, and a common electrode CE.

The pixel electrode AE may be disposed on the second passivation layer PAS2. The pixel electrode AE may be disposed to overlap any one of openings OPE1, OPE2, and OPE3 of the pixel defining film PDL. The pixel electrode AE may be electrically connected to the drain electrode DE of the thin film transistor TFT through the first and second connection electrodes CNE1 and CNE2.

The light emitting layer EL may be disposed on the pixel electrode AE. In an embodiment, for example, the light emitting layer EL may be an organic light emitting layer including or made of an organic material, but is not limited thereto. In an embodiment in which the light emitting layer EL corresponds to the organic light emitting layer, when the thin film transistor TFT applies a predetermined voltage to the pixel electrode AE of the light emitting element ED and the common electrode CE of the light emitting element ED receives a common voltage or a cathode voltage, each of the holes and electrons may move to the light emitting layer EL through the hole transporting layer and the electron transporting layer, and the holes and electrons may combine with each other in the light emitting layer EL to emit light.

The common electrode CE may be disposed on the light emitting layer EL. In an embodiment, for example, the common electrode CE may be implemented in the form of an electrode common to all pixels without being divided for each of the plurality of pixels. The common electrode CE may be disposed on the light emitting layer EL in first to third light emitting areas EA1, EA2, and EA3, and may be disposed on the pixel defining film PDL in an area excluding the first to third light emitting areas EA1, EA2, and EA3.

The common electrode CE may receive a common voltage or a low potential voltage. In the case in which the pixel electrode AE receives a voltage corresponding to the data voltage and the common electrode CE receives the low potential voltage, as a potential difference is formed between the pixel electrode AE and the common electrode CE, the light emitting layer EL may emit light.

The pixel defining film PDL may be provided with a plurality of openings OPE1, OPE2, and OPE3 defined therein, and may be disposed on the second passivation layer PAS2 and a portion of the pixel electrode AE. The pixel defining film PDL may include a first opening OPE1, a second opening OPE2, and a third opening OPE3, and each of the openings OPE1, OPE2, and OPE3 may expose a portion of the pixel electrode AE. In an embodiment, as described above, each of the openings OPE1, OPE2, and OPE3 of the pixel defining film PDL may define the first to third light emitting areas EA1, EA2, and EA3, and the first to third light emitting areas EA1, EA2, and EA3 may have different areas or sizes from each other. The pixel defining film PDL may separate and insulate the pixel electrodes AE of the plurality of light emitting elements ED from each other. The pixel defining film PDL may include a light absorbing material to prevent light reflection. In an embodiment, for example, the pixel defining film PDL may include a polyimide (PI)-based binder and a pigment in which red, green, and blue colors are mixed. Alternatively, the pixel defining film PDL may include a cardo-based binder resin and a mixture of lactam black pigment and blue pigment. Alternatively, the pixel defining film PDL may include carbon black.

A capping layer CPL (shown in FIG. 7) may be disposed on the common electrode CE. The capping layer CPL may include at least one inorganic film to prevent oxygen or moisture from permeating into the light emitting element layer EML. In an embodiment, the capping layer CPL may include aluminum oxide, titanium oxide, tantalum oxide, hafnium oxide, zinc oxide, silicon oxide, silicon nitride, and/or silicon oxynitride.

An auxiliary layer SPL (shown in FIG. 7) may be disposed on the capping layer CPL. In an embodiment, as will be described later, the auxiliary layer SPL together with the capping layer CPL may serve as an optical layer capable of improving light efficiency of the light emitting element ED or controlling viewing angle characteristics thereof. In an embodiment, the auxiliary layer SPL may include lithium fluoride (LiF), aluminum oxide, titanium oxide, tantalum oxide, hafnium oxide, zinc oxide, silicon oxide, silicon nitride, and/or silicon oxynitride.

The thin film encapsulation layer TFEL may be disposed on the auxiliary layer SPL to cover the plurality of light emitting elements ED. In an embodiment, The thin film encapsulation layer TFEL may be disposed directly on the auxiliary layer SPL. The thin film encapsulation layer TFEL may include at least one inorganic film to prevent oxygen or moisture from permeating into the light emitting element layer EML. The thin film encapsulation layer TFEL may include at least one organic film to protect the light emitting element layer EML from foreign substances such as dust.

In an embodiment, the thin film encapsulation layer TFEL may include a first encapsulation layer TFEL1, a second encapsulation layer TFEL2, and a third encapsulation layer TFEL3. The first encapsulation layer TFEL1 and the third encapsulation layer TFEL3 may be inorganic encapsulation layers, and the second encapsulation layer TFEL2 disposed therebetween may be an organic encapsulation layer.

Each of the first encapsulation layer TFEL1 and the third encapsulation layer TFEL3 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The second encapsulation layer TFEL2 may include a polymer-based material. Examples of the polymer-based material may include an acrylic resin, an epoxy-based resin, polyimide, polyethylene, or the like. In an embodiment, for example, the second encapsulation layer TFEL2 may include an acrylic resin, for example, polymethyl methacrylate or polyacrylic acid. The second encapsulation layer TFEL2 may be formed by curing a monomer or applying a polymer.

The touch sensing layer TSU may be disposed on the thin film encapsulation layer TFEL. The touch sensing layer TSU may include a first touch insulating layer SIL1, a second touch insulating layer SIL2, a touch electrode TEL, and a third touch insulating layer SIL3.

The first touch insulating layer SIL1 may be disposed on the encapsulation layer TFEL. The first touch insulating layer SIL1 may have insulating and optical functions. The first touch insulating layer SIL1 may include at least one inorganic film. Alternatively, the first touch insulating layer SIL1 may be omitted.

The second touch insulating layer SIL2 may cover the first touch insulating layer SIL1. Although not illustrated in the drawing, a touch electrode of another layer may be further disposed on the first touch insulating layer SIL1, and the second touch insulating layer SIL2 may cover such a touch electrode TEL. The second touch insulating layer SIL2 may have insulating and optical functions. In an embodiment, for example, the second touch insulating layer SIL2 may be an inorganic film including at least one selected from a silicon nitride layer, a silicon oxy nitride layer, a silicon oxide layer, a titanium oxide layer, and an aluminum oxide layer.

A portion of the touch electrode TEL may be disposed on the second touch insulating layer SIL2. Each of the touch electrodes TEL may not overlap the first to third light emitting areas EA1, EA2, and EA3. Each of the touch electrodes TEL may be formed as a single layer including or made of molybdenum (Mo), titanium (Ti), copper (Cu), aluminum (Al), or indium tin oxide (ITO), or be formed as a stacked structure (Ti/Al/Ti) of aluminum and titanium, a stacked structure (ITO/Al/ITO) of aluminum and ITO, an Ag—Pd—Cu (APC) alloy, and a stacked structure (ITO/APC/ITO) of an APC alloy and ITO.

The third touch insulating layer SIL3 may cover the touch electrode TEL and the second touch insulating layer SIL2. The third touch insulating layer SIL3 may have insulating and optical functions. The third touch insulating layer SIL3 may include or be made of the materials illustrated in the second touch insulating layer SIL2.

The light blocking layer BM may be disposed on the touch sensing layer TSU. The light blocking layer BM may be provided with a plurality of opening holes OPT1, OPT2, and OPT3 defined therein to overlap the light emitting areas EA1, EA2, and EA3. In an embodiment, for example, the first opening hole OPT1 may be disposed to overlap the first light emitting area EA1. The second opening hole OPT2 may be disposed to overlap the second light emitting area EA2, and the third opening hole OPT3 may be disposed to overlap the third light emitting area EA3. The area or size of each of the opening holes OPT1, OPT2, and OPT3 may be greater than that of the light emitting areas EA1, EA2, and EA3 defined by a bank structure BNS. As the opening holes OPT1, OPT2, and OPT3 of the light blocking layer BM are provided or formed to be greater than the light emitting areas EA1, EA2, and EA3, light emitted from the light emitting areas EA1, EA2, and EA3 may be visually recognized by a user not only from a front side of the display device 10 but also from a side surface thereof.

The light blocking layer BM may include a light absorbing material. In an embodiment, for example, the light blocking layer BM may include an inorganic black pigment or an organic black pigment. The inorganic black pigment may be carbon black, and the organic black pigment may include at least one selected from lactam black, perylene black, and aniline black, but is not limited thereto. The light blocking layer BM may prevent visible light from permeating and mixing colors between the first to third light emitting areas EA1, EA2, and EA3, thereby improving a color reproduction rate of the display device 10.

The antireflection layer RCL may be disposed on the light blocking layer BM and the touch sensing layer TSU. The antireflection layer RCL may include a colorant such as a dye or pigment that absorbs light, and may include dyes corresponding to colors of light emitted from the light emitting areas EA1, EA2, and EA3. The antireflection layer RCL may reduce reflected light of light incident from the outside or adjust a color of the light. According to an embodiment, the display device 10 may affect a color temperature of light emitted from the display device 10 together with a stacked structure of a thin film encapsulation layer TFEL, which will be described later.

The overcoat layer OC may be disposed on the antireflection layer RCL to planarize an upper end thereof. The overcoat layer OC may be a colorless light-transmitting layer having no color in a visible light band. In an embodiment, for example, the overcoat layer OC may include a colorless light-transmitting organic material such as an acryl-based resin.

Figure 7:
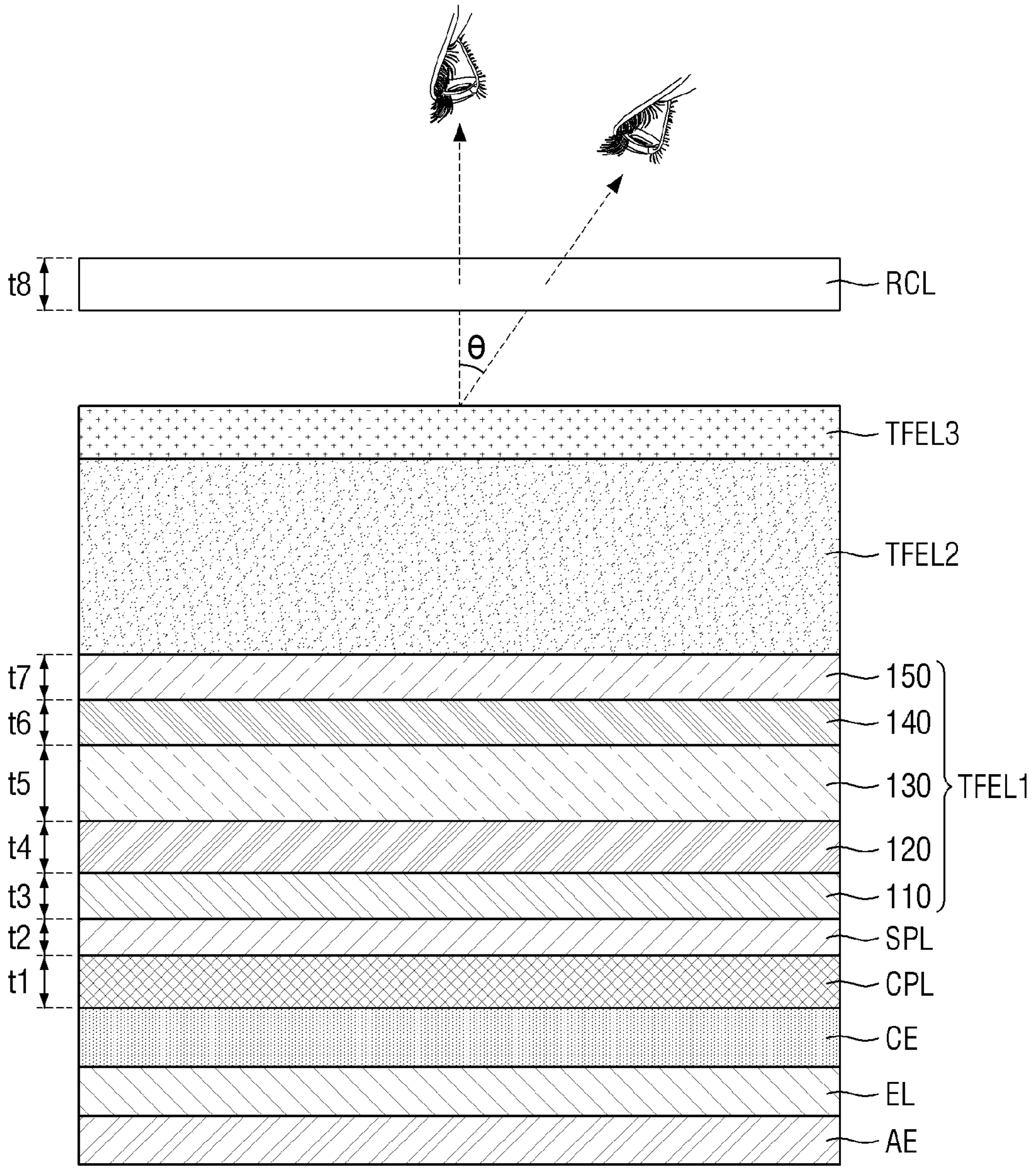
FIG. 7 is a cross-sectional view illustrating in greater detail a stacked structure of a light emitting element and an encapsulation layer of the display device according to an embodiment.

FIG. 7 is a cross-sectional view illustrating in greater detail a stacked structure of a light emitting element and an encapsulation layer of the display device according to an embodiment.

Referring to FIG. 7, an embodiment of the display device 10 may include a structure in which the light emitting element ED and a plurality of inorganic or organic films disposed thereon are stacked. In an embodiment, for example, the display device 10 may include the capping layer CPL, the auxiliary layer SPL, the first encapsulation layer TFEL1, the second encapsulation layer TFEL2, the third encapsulation layer TFEL3, and the antireflection layer RCL sequentially disposed on the common electrode CE of the light emitting element ED. Each of the capping layer CPL disposed directly on the light emitting element ED and the auxiliary layer SPL disposed on the capping layer CPL may include an inorganic insulating material, but may have different materials or different refractive indices and thicknesses from each other. Light emitted from the light emitting element ED is emitted through the capping layer CPL and the auxiliary layer SPL, and as the capping layer CPL and the auxiliary layer SPL have different refractive indices from each other, light may be reflected at an interface the capping layer CPL and the auxiliary layer SPL. The display device 10 may control light efficiency (or light output efficiency) and viewing angle characteristics of the light emitting element ED as desired by disposing optical layers capable of reflecting light on the light emitting element ED using layers having different refractive indices from each other. The display device 10 may further include other optical layers using other layers in addition to the capping layer CPL and the auxiliary layer SPL.

According to an embodiment, in the display device 10, the first encapsulation layer TFEL1 may include a plurality of inorganic insulating layers 110, 120, 130, 140, and 150, and in addition to the capping layer CPL and the auxiliary layer SPL, the plurality of inorganic insulating layers 110, 120, 130, 140, and 150 may reflect light at interfaces therebetween, thereby serving as optical layers. The first encapsulation layer TFEL1 may include a first inorganic insulating layer 110, a second inorganic insulating layer 120, a third inorganic insulating layer 130, a fourth inorganic insulating layer 140, and a fifth inorganic insulating layer 150 sequentially disposed on the auxiliary layer SPL. The layers sequentially disposed from the capping layer CPL to the fifth inorganic insulating layer 150 may include different materials and have different refractive indices and thicknesses from each other. Light emitted from the light emitting element ED pass through the fifth inorganic insulating layer 150 from the capping layer CPL and is emitted in an upward direction, and the light may be partially and repeatedly reflected and refracted while passing through the interface of the layers having different refractive indices from each other and may be emitted. By adjusting the refractive index and thickness of each layer disposed on the light emitting element ED, light output efficiency and viewing angle characteristics of the light emitted from the light emitting element ED may be controlled under (or set to have) desired conditions.

Hereinafter, as the optical layers disposed on the light emitting element ED, the capping layer CPL, the auxiliary layer SPL, and the plurality of inorganic insulating layers 110, 120, 130, 140, and 150 of the first encapsulation layer TFEL1 will be described.

The common electrode CE may include a transparent conductive electrode material so that light generated in the light emitting layer EL may be emitted. The common electrode CE may have a thickness in a range of about 200 angstrom (Å) to about 300 Å, and for example, the common electrode CE may have a thickness of about 250 Å.

The capping layer CPL may include at least one selected from silicon oxide (SiOx), silicon nitride (SiNx), and silicon oxynitride (SiOxNy). The capping layer CPL may have a refractive index n1 in a range of about 1.60 to about 2.30 and a thickness t1 in a range of about 200 Å to about 300 Å. In an embodiment, for example, the capping layer CPL may have the refractive index n1 of about 2.0 and the thickness t1 of about 200 Å or about 250 Å.

The auxiliary layer SPL may include bismuth (Bi). The auxiliary layer SPL may be disposed on the capping layer CPL and may have a refractive index similar to that of the capping layer CPL. In an embodiment, for example, the auxiliary layer SPL may have a refractive index n2 of about 2.0 or greater and a thickness t2 in a range of about 80 Å to about 100 Å. In an embodiment, for example, the auxiliary layer SPL may have the thickness t2 of about 95 Å and may have the refractive index n2 of about 2.1.

According to an embodiment, in the display device 10, the plurality of inorganic insulating layers disposed on the capping layer CPL and the auxiliary layer SPL may include an insulating layer having a relatively high refractive index and an insulating layer having a relatively low refractive index. The inorganic insulating layers disposed in contact with each other among the plurality of inorganic insulating layers may have different refractive indices from each other. The plurality of inorganic insulating layers may have a structure in which an inorganic insulating layer having a high refractive index and an inorganic insulating layer having a low refractive index are stacked on each other. In an embodiment, for example, the capping layer CPL and the auxiliary layer SPL may be high refractive index layers having a relatively high refractive index, and the inorganic insulating layers 110, 120, 130, 140, and 150 of the first encapsulation layer TFEL1 disposed on the capping layer CPL and the auxiliary layer SPL may have a refractive index lower than that of the capping layer CPL and the auxiliary layer SPL. Among the inorganic insulating layers, the first inorganic insulating layer 110 of the first encapsulation layer TFEL1 may be a high refractive index layer, and the second inorganic insulating layer 120 thereof may be a low refractive index layer. Each of the third inorganic insulating layer 130 and the fourth inorganic insulating layer 140 may be a medium refractive index layer having a refractive index having a value between the refractive index of the first inorganic insulating layer 110 and the refractive of the second inorganic insulating layer 120.

The first inorganic insulating layer 110 may include at least one selected from silicon oxide (SiOx), silicon nitride (SiNx), and silicon oxynitride (SiOxNy). The first inorganic insulating layer 110 may be disposed on the auxiliary layer SPL and have a refractive index smaller (or less) than that of the auxiliary layer SPL. In an embodiment, the first inorganic insulating layer 110 may be disposed directly on the auxiliary layer SPL. In an embodiment, for example, the first inorganic insulating layer 110 may have a refractive index n3 in a range of about 1.70 to about 2.00 and a thickness t3 in a range of about 400 Å to about 3500 Å. In an embodiment, the first inorganic insulating layer 110 may include silicon oxynitride (SiOxNy), and may have a refractive index n3 of about 1.89 and a thickness t3 in a range of about 1700 Å to about 1800 Å.

The second inorganic insulating layer 120 may include at least one selected from silicon oxide (SiOx), silicon nitride (SiNx), and silicon oxynitride (SiOxNy). The second inorganic insulating layer 120 may be disposed on the first inorganic insulating layer 110 to have a smaller refractive index than that of the first inorganic insulating layer 110. In an embodiment, for example, the second inorganic insulating layer 120 may have a refractive index n4 in a range of about 1.20 to about 1.62 and a thickness t4 in a range of about 200 Å to about 2400 Å. In an embodiment, the second inorganic insulating layer 120 may include silicon oxynitride (SiOxNy), and have the refractive index n4 of about 1.48 and the thickness t4 in a range of about 1100 Å to about 1200 Å.

The above-described capping layer CPL, auxiliary layer SPL, first inorganic insulating layer 110, and second inorganic insulating layer 120 may be layers that have a major influence on optical characteristics of the display device 10. The layers may need to be finely adjusted in thickness and refractive index thereof in order to achieve a target resonance characteristic for each wavelength. The thickness and refractive index ranges of each layer may be ranges designed or determined to have optical characteristics targeted by the display device 10.

The third inorganic insulating layer 130 may include at least one selected from silicon oxide (SiOx), silicon nitride (SiNx), and silicon oxynitride (SiOxNy). The third inorganic insulating layer 130 may be disposed on the second inorganic insulating layer 120 to have a refractive index greater than or equal to that of the second inorganic insulating layer 120. In an embodiment, for example, the third inorganic insulating layer 130 may have a refractive index n5 in a range of about 1.48 to about 1.89 and a thickness t5 of about 4000 Å or greater. In an embodiment, the third inorganic insulating layer 130 may include silicon oxynitride (SiOxNy), and have the refractive index n5 of about 1.77 and the thickness t5 of about 7000 Å. The third inorganic insulating layer 130 may be a layer having a relatively small influence on the optical characteristics in the first encapsulation layer TFEL1, and may be a layer for securing reliability such as moisture permeation and oxidation prevention. Accordingly, the third inorganic insulating layer 130 may have a relatively large thickness t5 (about 4000 Å or greater).

The fourth inorganic insulating layer 140 may include at least one selected from silicon oxide (SiOx), silicon nitride (SiNx), and silicon oxynitride (SiOxNy). The fourth inorganic insulating layer 140 may be disposed on the third inorganic insulating layer 130 and may have a refractive index equal to or smaller than that of the third inorganic insulating layer 130. In an embodiment, for example, the fourth inorganic insulating layer 140 may have a refractive index n6 in a range of about 1.52 to about 1.70 and a thickness t6 in a range of about 300 Å to about 1000 Å. In an embodiment, the fourth inorganic insulating layer 140 may include silicon oxynitride (SiOxNy), and have the refractive index n6 of about 1.62 and the thickness t6 of about 700 Å. The fourth inorganic insulating layer 140 may have a thickness such that reflections that occur at the interface with the third inorganic insulating layer 130 and the interface with the fifth inorganic insulating layer 150 may destructively interfere with each other.

The fifth inorganic insulating layer 150 may include at least one selected from O-rich silicon oxide (SiOx), silicon nitride (SiNx), and silicon oxynitride (SiOxNy). In an embodiment, the fifth inorganic insulating layer 150 may include O-rich silicon oxynitride (SiOxNy). The fifth inorganic insulating layer 150 may have a refractive index n7 of about 1.50 and a thickness t7 of about 800 Å.

In an embodiment, the refractive index n6 of the fourth inorganic insulating layer 140 may satisfy Inequality 1 below.

$$\min(n5, n7) + |n5 - n7| \times 0.25 < n6 < \min(n5, n7) + |n5 - n7| \times 0.75 \qquad \text{[Inequality 1]}$$

Here, n5 denotes the refractive index of the third inorganic insulating layer 130, n7 denotes the refractive index of the fifth inorganic insulating layer 150, min(n5, n7) denote a minimum value among n5 and n7, and |n5−n7| denotes an absolute value of a difference between n5 and n7.

The second encapsulation layer TFEL2 may be an organic insulating layer. The second encapsulation layer TFEL2 may have a refractive index in a range of about 1.8 to about 1.9.

The third encapsulation layer TFEL3 may include at least one selected from silicon oxide (SiOx), silicon nitride (SiNx), and silicon oxynitride (SiOxNy). The third encapsulation layer TFEL3 may have a refractive index of about 1.49.

In an embodiment of the display device 10, the thicknesses of the capping layer CPL, the auxiliary layer SPL, and the plurality of inorganic insulating layers 110, 120, 130, 140, and 150 of the first encapsulation layer TFEL1 may be designed or determined to be in a specific range by optical characteristics, reliability, and TACT (or Takt) time. In the inorganic insulating layer, as the refractive index thereof is high and the thickness thereof is increased, the reliability characteristics due to moisture permeability are improved, but the TACT time may increase, an optical absorption may increase, and a dispersion of the thickness may increase. In particular, when an optical cavity length is increased, it may be difficult to secure a cavity characteristic as an optical path becomes longer than a coherent length or a high-order cavity is used. Furthermore, since final optical characteristics change according to a spectrum of the light as the light passes through the plurality of layers in the display device 10, it may be desired to finely adjust the thickness and refractive index of the inorganic insulating layer so that the cavity characteristics for each wavelength may be adjusted according to the material of the inorganic insulating layer.

In addition, in the display device 10, the antireflection layer RCL may also affect optical characteristics together with the first encapsulation film TFEL1. Unlike the first encapsulation layer TFEL1, since the antireflection layer RCL is not disposed adjacent to the light emitting element ED, the optical characteristics of the display device 10 may vary depending on the thickness of the antireflection layer RCL. In an embodiment, the antireflection layer RCL may have a thickness of about 2.0 micrometers (μm) or greater.

In an embodiment, for example, the antireflection layer RCL may have a thickness t8 of about 2.7 μm.

The display device 10 may have the structure in which the capping layer CPL, the auxiliary layer SPL, the first inorganic insulating layer 110, the second inorganic insulating layer 120, and the third inorganic insulating layer 130 are sequentially stacked, and the layers having high and low refractive indices may be stacked from the capping layer CPL to the third inorganic insulating layer 130. As the plurality of layers having different refractive indices from each other are sequentially stacked, an interface capable of refracting or reflecting light may be defined or formed at the interface between the layers in which the capping layer CPL, the auxiliary layer SPL, the first inorganic insulating layer 110, the second inorganic insulating layer 120, and the third inorganic insulating layer 130 are disposed to be in contact with each other. In an embodiment, as the first inorganic insulating layer 110, the second inorganic insulating layer 120, and the third inorganic insulating layer 130 each includes silicon nitride (SiNx), silicon oxide (SiOx), and silicon oxynitride (SiOxNy) and have different refractive indices, it is possible to form a plurality of reflective interfaces together with the capping layer CPL and the auxiliary layer SPL. The display device 10 according to an embodiment may control the light efficiency of the light emitting element ED, or the light output efficiency and the viewing angle characteristics of the light emitted from the light emitting element ED as desired by including the stacked structure of the layers having different refractive indices from each other as described above.

Figure 8:
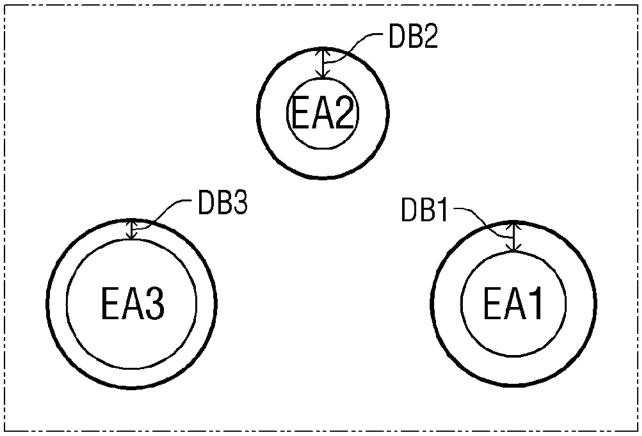
FIG. 8 is a plan view illustrating gaps between openings and opening holes of different light emitting areas of the display device according to an embodiment.

FIG. 8 is a plan view illustrating gaps between openings and opening holes of different light emitting areas of the display device according to an embodiment.

Referring to FIGS. 5, 6, and 8, the display device 10 according to an embodiment has opening intervals DB1, DB2, and DB3 defined between the light emitting areas EA1, EA2, and EA3 and the opening holes OPT1, OPT2, and OPT3, and may include light emitting areas EA1, EA2, and EA3 having different opening intervals DB1, DB2, and DB3 among the plurality of light emitting areas EA1, EA2, and EA3. In an embodiment, for example, the first light emitting area EA1 in which a first light emitting element ED1 is disposed has a first opening interval DB1 between the first opening OPEL of the pixel defining film PDL and the first opening hole OPT1 of the light blocking layer BM. The second light emitting area EA2 in which a second light emitting element ED2 is disposed has a second opening interval DB2 between the second opening OPE2 of the pixel defining film PDL and the second opening hole OPT2 of the light blocking layer BM, and the third light emitting area EA3 in which a third light emitting element ED3 is disposed has a third opening interval DB3 between the third opening OPE3 of the pixel defining film PDL and the third opening hole OPT3 of the light blocking layer BM. The first to third opening intervals DB1, DB2, and DB3 may be intervals between the openings OPE1, OPE2, and OPE3 and the opening holes OPT1, OPT2, and OPT3 in a plan view or when viewed in the third direction DR3.

In an embodiment, as described above, the display device 10 may adjust or set the materials, refractive indices, and thicknesses of the first encapsulation layer TFEL1, the capping layer CPL, and the auxiliary layer SPL of the thin film encapsulation layer TFEL, thereby controlling the color of the display device 10 and the color of reflected light. In addition, the display device may include the light emitting areas EA1, EA2, and EA3 having different opening intervals DB1, DB2, and DB3 among the plurality of light emitting areas EA1, EA2, and EA3 in which different light emitting elements ED1, ED2, and ED3 are disposed, thereby controlling a color of a screen displayed on the display device 10.

In the display device 10, the first light emitting area EA1 that emits red light and the second light emitting area EA2 that emits green light may have the same opening interval as each other (i.e., DB1=DB2), and the third light emitting area EA3 that emits blue light may have an opening interval than those of other light emitting areas (o/e/. DB3<DB1=DB2). In an embodiment, the first light emitting area EA1 and the second light emitting area EA2 may have the opening intervals DB1 and DB2 of about 5.72 μm, respectively, and the third light emitting area EA3 may have the opening interval DB3 of about 4.72 μm or about 3.72 μm. In the display device 10, as the opening interval of the third light emitting area EA3 emitting the blue light is smaller than that of other light emitting areas, it is possible to reduce that the screen of the display device 10 is visually recognized as a blue color at a specific viewing angle when the display device 10 is viewed. As will be described later, the color of the screen of the display device 10 may vary depending on the viewing angle of the display device 10. The display device 10 may minimize a difference in color on the screen viewed from different viewing angles by adjusting the material of the thin film encapsulation layer TFEL and the opening intervals of the light emitting areas EA1, EA2, and EA3.

Figure 9:
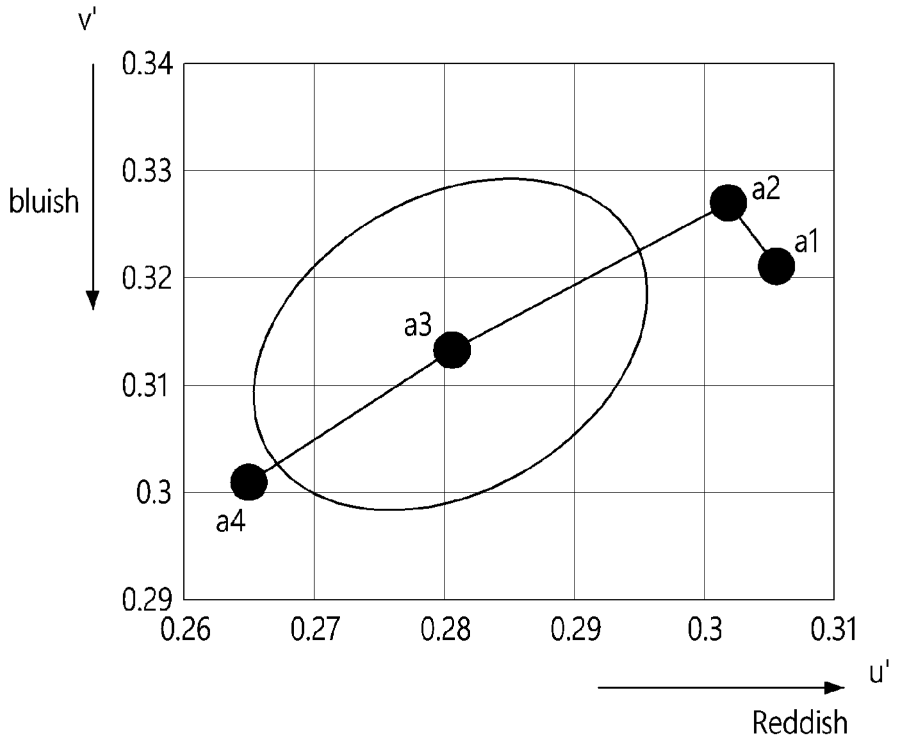
FIG. 9 is a view illustrating a CIE 1931 coordinate system of a change in white color for each viewing angle of the display device of FIG. 7.

FIG. 9 is a view illustrating a CIE 1931 coordinate system of a change in white color for each viewing angle of the display device of FIG. 7.

FIG. 9 illustrates CIE1931 color coordinates (u', v') showing a change in color for each viewing angle. A horizontal axis of the CIE1931 color coordinates may be u' coordinates, and a vertical axis thereof may be v' coordinates. A reddish phenomenon may occur as a color coordinates value at a specific angle moves to the right from the u' coordinates, and a bluish phenomenon may occur as a color coordinates value at a specific angle moves to an upper side from the v' coordinates.

Referring to FIG. 9, in the display device 10 according to an embodiment, when the display device 10 is viewed from different angles a1, a2, a3, and a4, color coordinate values of light emitted from the display device 10 may move. In an embodiment, for example, the color coordinate value of the display device 10 viewed from the angle a1 may be different from the color coordinate values of the display device 10 viewed from the angles a2, a3, and a4. The difference in color coordinate values may cause a color shift according to a viewing angle at which the display device 10 is viewed, because the light emitted from the light emitting element ED is refracted and reflected by the capping layer CPL, the auxiliary layer SPL, and the thin film encapsulation layer TFEL and is then emitted. Here, the fact that the difference in color coordinate values viewed from other angles, for example, the angles a2, a3, and a4 with respect to a color coordinate value viewed from a specific angle, for example, the angle a1 is not large may mean that the color shift of the light emitted from the display device 10 is not large depending on an angle from which the display device 10 is viewed.

In the display device 10, the degree of color shift phenomenon depending on the viewing angle may be measured according to the coordinate values on the CIE1931 color coordinates (u', v') when the display device 10 is viewed at about 0° (a1), about 30° (a2), about 45° (a3), and about 60° (a4). In the display device 10, as the capping layer CPL, the auxiliary layer SPL, and the first to fifth inorganic insulating layers 110, 120, 130, 140, and 150 are sequentially stacked and are stacked as a layer with a high refractive index and a layer with a low refractive index, it is possible to further reduce a dispersion of a movement trajectory in a color temperature direction in the CIE 1931 coordinate system. Alternatively, the display device 10 may minimize the change in coordinate values according to the viewing angles on the CIE1931 color coordinates (u', v').

As illustrated in FIG. 9, on the CIE 1931 color coordinates (u', v'), based on the u' coordinate value and v' coordinate value at the angle a1, at the angle a2, the u' coordinate value may be smaller, but the v' coordinate value may be greater, and at the angles a3 and a4, the u' coordinate value and the v' coordinate value may be smaller, respectively. Here, as an interval between adjacent different angles, or a deviation between the u' coordinate value and the v' coordinate value is smaller, this may mean that the display device 10 has a small color deviation of screen viewed from different viewing angles.

In the display device 10, at angle a2 based on the angle a1, the u' coordinate value may be smaller but the v' coordinate value may be greater, and the display device 10 may reduce a reddish phenomenon of the screen at the angle a2. in an embodiment, for example, the angle a1 may be about 0° and the angle a2 may be about 30°, and the display device 10 may reduce a reddish phenomenon when viewed at the angle of about 30°. As described above, the display device 10 may include the capping layer CPL, the auxiliary layer SPL, and the first encapsulation layer TFEL1 to reduce the reddish phenomenon at the angle of about 30°. As described above, the display device 10 may include the capping layer CPL, the auxiliary layer SPL, and the first encapsulation layer TFEL1 to reduce the reddish phenomenon at the angle of about 30°.

In the display device 10, at the angle a3 and the angle a4 based on the angle a1, the u' coordinate value and the v' coordinate value may be smaller, but the v' coordinate value may be 0.29 or greater. In an embodiment, for example, the v' coordinate value may be 0.31 or greater at the angle a3, and the v' coordinate value may be 0.3 or greater at the angle a4. In the display device 10, the third light emitting area EA3 emitting blue light may have a size of the opening interval DB3 smaller than that of other light emitting areas, and the bluish phenomenon at the angle a3 and the angle a4 may be reduced. In an embodiment, for example, the angle a3 may be about 45° and the angle a4 may be about 60°, and the display device 10 may reduce the bluish phenomenon when viewed at the angle of about 45° or the angle of about 60°.

In addition, in the display device 10, a deviation of coordinate values between the angle a2 and the angle a3 and a deviation of coordinate values between the angle a3 and the angle a4 may be minimized to reduce a color deviation when viewing the display device 10 from different viewing angles. As the deviation of coordinate values between the angle a2, the angle a3, and the angle a4 increases, a screen color deviation depending on the viewing angle of the display device 10 may be large. However, in the display device 10, it is possible to reduce the deviation of screen color according to the viewing angle of the display device 10 by reducing the deviation of the coordinate values between the angle a2, the angle a3, and the angle a4. The display device 10 may be designed so that color coordinates of the screen viewed from different angles are positioned within a specific area in the CIE 1931 coordinate values by adjusting the material of the thin film encapsulation film TFEL and the opening interval of the light emitting areas.

In an embodiment of the display device 10 of FIG. 9, the common electrode CE may have a thickness of about 130 Å, the capping layer CPL may have a thickness of about 250 Å, the auxiliary layer SPL may have a thickness of about 95 Å, the first inorganic insulating layer 110 may have a refractive index of about 1.89 and a thickness of about 1700 Å, the second inorganic insulating layer 120 may have a refractive index of about 1.48 and a thickness of about 1300 Å, the third inorganic insulating layer 130 may have a refractive index of about 1.77 and a thickness of about 7000 Å, and the fourth inorganic insulating layer 140 may have a refractive index of about 1.62 and a thickness of about 700 Å. In such an embodiment of the display device 10 of FIG. 9, the first light emitting area EA1 and the second light emitting area EA2 may have the opening intervals DB1 and DB2 of about 5.72 μm, and the third light emitting area EA3 may have the opening interval DB3 of about 4.72 μm. The CIE 1931 color coordinates (u', v') under the above-described conditions may be those illustrated in FIG. 9.

The display device 10 may finely adjust the coordinate values at different angles on the CIE 1931 color coordinates (u', v') by adjusting the thicknesses of the plurality of layers and the opening interval of the light emitting area.

Figure 10:
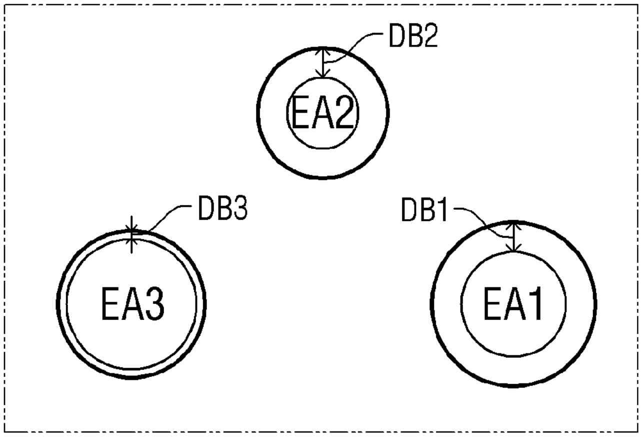
FIG. 10 is a plan view illustrating gaps between openings and opening holes of different light emitting areas of a display device according to an alternative embodiment.
Figure 11:
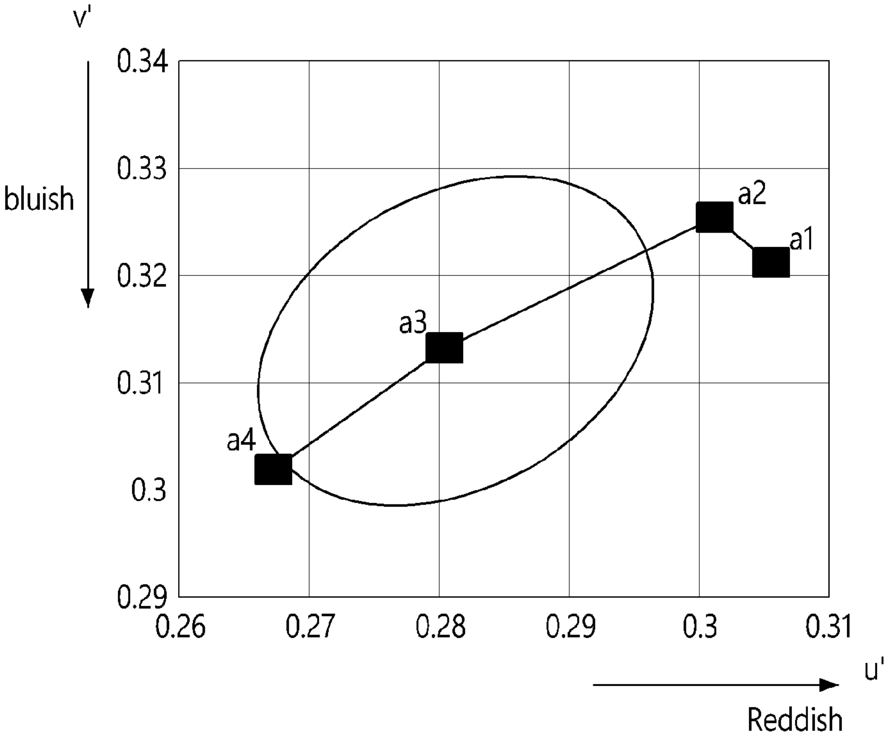
FIG. 11 is a view illustrating a CIE 1931 coordinate system of a change in white color for each viewing angle of the display device of FIG. 10.

FIG. 10 is a plan view illustrating gaps between openings and opening holes of different light emitting areas of a display device according to an alternative embodiment. FIG. 11 is a view illustrating a CIE 1931 coordinate system of a change in white color for each viewing angle of the display device of FIG. 10.

Referring to FIGS. 10 and 11, in the display device 10 according to an embodiment, the opening interval DB3 of the third light emitting area EA3 may be smaller than that of the display device 10 of FIG. 9. In the display device 10 of FIGS. 10 and 11, the first light emitting area EA1 and the second light emitting area EA2 may have the opening intervals DB1 and DB2 of about 5.72 μm, and the third light emitting area EA3 may have the opening interval DB3 of about 3.72 μm. In the display device 10, the bluish phenomenon at a specific viewing angle may be further reduced by setting a greater deviation of the opening interval between the third light emitting area EA3 and the other light emitting areas EA1 and EA2.

For example, in the display device 10 of FIGS. 10 and 11, the v' coordinate values at the angles a3 and a4 may have greater values than those of the display device 10 of FIG. 9. That is, the display device 10 of FIGS. 10 and 11 may further reduce the bluish phenomenon at the angles a3 and a4.

Figure 12:
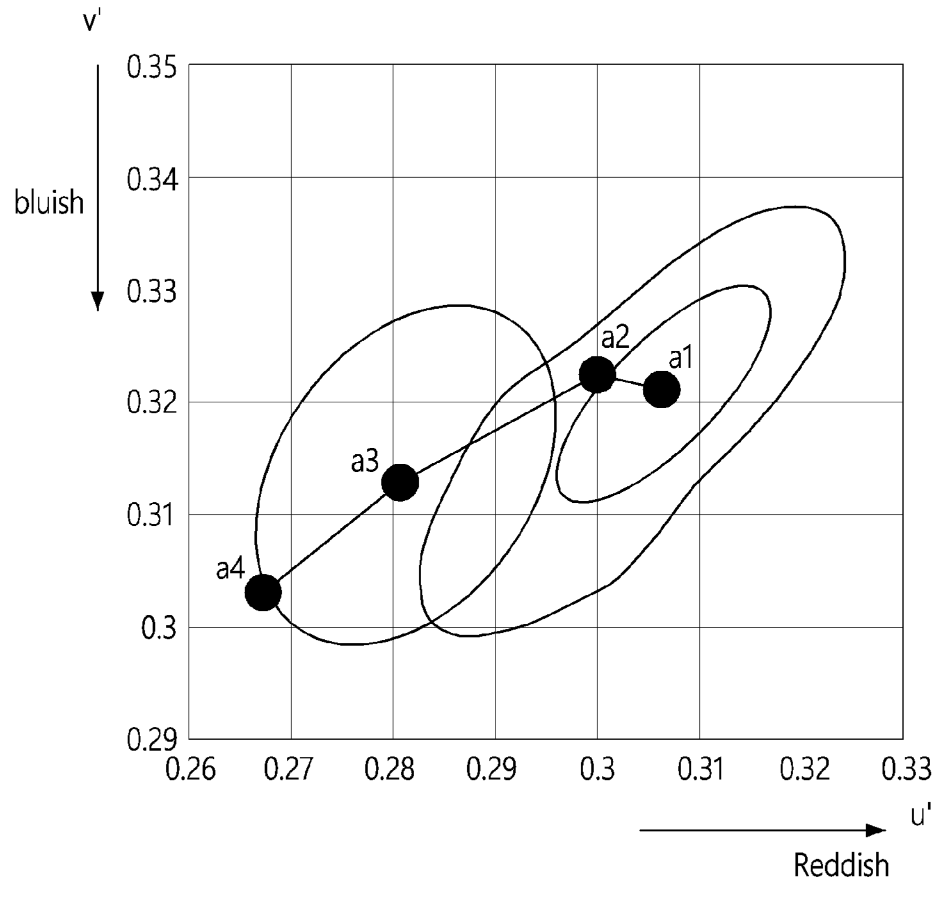
FIGS. 12 and 13 are views illustrating a CIE 1931 coordinate system of a change in white color for each viewing angle of a display device according to other alternative embodiments.
Figure 13:
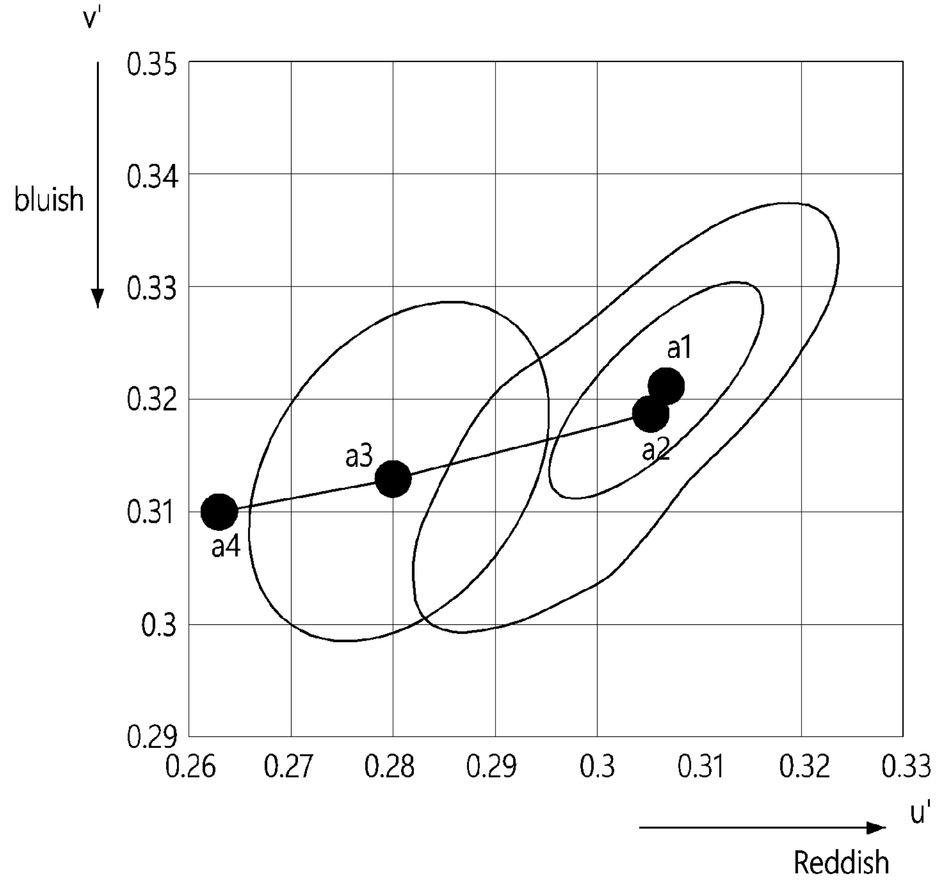

FIGS. 12 and 13 are views illustrating a CIE 1931 coordinate system of a change in white color for each viewing angle of a display device according to other alternative embodiment.

Referring to FIG. 12, in the display device 10 according to an embodiment, the thickness of the capping layer CPL may be smaller than that of the display device 10 of FIG. 9. In the display device 10 of FIG. 12, the common electrode CE may have a thickness of about 130 Å, the capping layer CPL may have a thickness of about 200 Å, the auxiliary layer SPL may have a thickness of about 95 Å, the first inorganic insulating layer 110 may have a refractive index of about 1.89 and a thickness of about 1700 Å, the second inorganic insulating layer 120 may have a refractive index of about 1.48 and a thickness of about 1300 Å, the third inorganic insulating layer 130 may have a refractive index of about 1.77 and a thickness of about 7000 Å, and the fourth inorganic insulating layer 140 may have a refractive index of about 1.62 and a thickness of about 700 Å. In an embodiment of the display device 10 of FIG. 9, the first light emitting area EA1 and the second light emitting area EA2 may have the opening intervals DB1 and DB2 of about 5.72 μm, and the third light emitting area EA3 may have the opening interval DB3 of about 4.72 μm. The display device 10 of FIG. 12 may be substantially the same as the display device 10 of FIG. 9 except that the thickness of the capping layer CPL is smaller, and the CIE 1931 color coordinates (u', v') under the above-described conditions may be those illustrated in FIG. 12.

The display device 10 of FIG. 12 may have a deviation of the v' coordinate values at the angle a1 and the angle a2 smaller than that of the display device 10 of FIG. 9. In addition, a magnitude of the v' coordinate value at the angle a4 may be greater, and the deviation of coordinate value between the angle a2 and the angle a3 and the deviation of coordinate value between the angle a3 and the angle a4 may be smaller, respectively. That is, as the display device 10 of FIG. 12 has a thickness of the capping layer CPL smaller than that of the display device 10 of FIG. 9, the deviation of color at different viewing angles and the bluish phenomenon at different viewing angles may be further reduced.

Referring to FIG. 13, the display device 10 according to an embodiment may have a thickness of the first inorganic insulating layer 110 smaller than that of the display device 10 of FIG. 9. In an embodiment of the display device 10 of FIG. 13, the common electrode CE may have a thickness of about 130 Å, the capping layer CPL may have a thickness of about 250 Å, the auxiliary layer SPL may have a thickness of about 95 Å, the first inorganic insulating layer 110 may have a refractive index of about 1.89 and a thickness of about 1600 Å, the second inorganic insulating layer 120 may have a refractive index of about 1.48 and a thickness of about 1300 Å, the third inorganic insulating layer 130 may have a refractive index of about 1.77 and a thickness of about 7000 Å, and the fourth inorganic insulating layer 140 may have a refractive index of about 1.62 and a thickness of about 700 Å. In the display device 10 of FIG. 9, the first light emitting area EA1 and the second light emitting area EA2 may have the opening intervals DB1 and DB2 of about 5.72 μm, and the third light emitting area EA3 may have the opening interval DB3 of about 4.72 μm. The display device 10 of FIG. 13 may be substantially the same as the display device 10 of FIG. 9 except that the thickness of the first inorganic insulating layer 110 is smaller, and the CIE 1931 color coordinates (u', v') under the above-described conditions may be those illustrated in FIG. 13.

The display device 10 of FIG. 13 may have a deviation of the v' coordinate values at the angle a1 and the angle a2 smaller than that of the display device 10 of FIG. 9. In addition, a magnitude of the v' coordinate value at the angle a4 may be greater, and the deviation of coordinate value between the angle a2 and the angle a3 and the deviation of coordinate value between the angle a3 and the angle a4 may be smaller, respectively. As the display device 10 of FIG. 13 has a thickness of the capping layer CPL smaller than that of the display device 10 of FIG. 9, the deviation of color at different viewing angles and the bluish phenomenon at different viewing angles may be further reduced. In particular, in the display device 10 of FIG. 13, the v' coordinate values at the angles a1 to a4 may have values around 0.31 to 0.32, and the bluish phenomenon of the display device 10 may be significantly reduced.

The invention should not be construed as being limited to the embodiments set forth herein. Rather, these embodiments are provided so that this disclosure will be thorough and complete and will fully convey the concept of the invention to those skilled in the art. While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a pixel defining film disposed on a substrate, wherein a plurality of openings is defined through the pixel defining film;

a plurality of light emitting elements disposed in the openings, respectively, wherein the light emitting elements emit light of different colors from each other;

a capping layer disposed on a common electrode of the light emitting elements;

an auxiliary layer disposed on the capping layer and including bismuth;

a thin film encapsulation layer including a first encapsulation layer disposed on the auxiliary layer, a second encapsulation layer disposed on the first encapsulation layer, and a third encapsulation layer disposed on the second encapsulation layer;

a light blocking layer disposed on the thin film encapsulation layer, wherein a plurality of opening holes is defined through the light blocking layer to overlap the openings, respectively; and an antireflection layer disposed on the light blocking layer, wherein the first encapsulation layer includes:

a first inorganic insulating layer disposed on the auxiliary layer and including silicon oxynitride;

a second inorganic insulating layer disposed on the first inorganic insulating layer and including silicon oxynitride; and a third inorganic insulating layer disposed on the second inorganic insulating layer and including silicon oxynitride, the capping layer has a thickness in a range of about 200 Å to about 300 Å, the auxiliary layer has a thickness in a range of about 80 Å to about 100 Å, the first inorganic insulating layer has a thickness in a range of about 1700 Å to about 1800 Å, the second inorganic insulating layer has a thickness in a range of about 1100 Å to about 1200 Å, and the third inorganic insulating layer has a thickness of about 4000 Å or greater, and a first opening interval between a first opening of the openings, in which a first light emitting element of the light emitting elements which emits light of a first color is disposed, and a first opening hole of the opening holes overlapping the first opening is greater than a second opening interval between a second opening of the openings, in which a second light emitting element of the light emitting elements which emits light of a second color different from the first color is disposed, and a second opening hole of the opening holes overlapping the second opening.

2. The display device of claim 1, wherein the first inorganic insulating layer is disposed directly on the auxiliary layer.

3. The display device of claim 1, wherein the auxiliary layer has a refractive index greater than a refractive index of the capping layer, the first inorganic insulating layer has a refractive index greater than the refractive index of the auxiliary layer, the second inorganic insulating layer has a refractive index smaller than the refractive index of the first inorganic insulating layer, and the third inorganic insulating layer has a refractive index greater than the refractive index of the second inorganic insulating layer.

4. The display device of claim 3, wherein the refractive index of the capping layer is in a range of about 1.60 to about 2.30, the refractive index of the auxiliary layer is about 2.0 or greater and greater than the refractive index of the capping layer, the refractive index of the first inorganic insulating layer is in a range of about 1.70 to about 2.0, the refractive index of the second inorganic insulating layer is in a range of about 1.20 to about 1.62, and the refractive index of the third inorganic insulating layer is in a range of about 1.48 to about 1.89 and greater than the refractive index of the second inorganic insulating layer.

5. The display device of claim 3, wherein the refractive index of the first inorganic insulating layer is about 1.89, the refractive index of the second inorganic insulating layer is about 1.48, and the refractive index of the third inorganic insulating layer is about 1.77.

6. The display device of claim 5, wherein the common electrode of the light emitting elements has a thickness of about 130 Å, the thickness of the capping layer is about 250 Å, the thickness of the auxiliary layer is about 95 Å, the thickness of the first inorganic insulating layer is about 1700 Å, the thickness of the second inorganic insulating layer is about 1300 Å, and the thickness of the third inorganic insulating layer is about 7000 Å.

7. The display device of claim 5, wherein the common electrode of the light emitting elements has a thickness of about 130 Å, the thickness of the capping layer is about 200 Å, the thickness of the auxiliary layer is about 95 Å, the thickness of the first inorganic insulating layer is about 1700 Å, the thickness of the second inorganic insulating layer is about 1300 Å, and the thickness of the third inorganic insulating layer is about 7000 Å.

8. The display device of claim 5, wherein the common electrode of the light emitting elements has a thickness of about 130 Å, the thickness of the capping layer is about 250 Å, the thickness of the auxiliary layer is about 95 Å, the thickness of the first inorganic insulating layer is about 1600 Å, the thickness of the second inorganic insulating layer is about 1300 Å, and the thickness of the third inorganic insulating layer is about 7000 Å.

9. The display device of claim 1, wherein the first encapsulation layer further includes a fourth inorganic insulating layer disposed on the third inorganic insulating layer, and a fifth inorganic insulating layer disposed on the fourth inorganic insulating layer, and the fourth inorganic insulating layer includes silicon oxynitride and has a thickness in a range of about 300 Å to about 1000 Å.

10. The display device of claim 1, wherein the first opening interval is about 5.72 μm, and the second opening interval is about 4.72 μm.

11. The display device of claim 1, wherein the first opening interval is about 5.72 μm, and the second opening interval is about 3.72 μm.

12. The display device of claim 1, wherein the antireflection layer has a thickness of about 2 μm or greater.

13. An electronic device comprising:

a display device including a display area and a non-display area surrounding the display area; and an optical device disposed to overlap a portion of the display area of the display device, wherein the display device includes:

a pixel defining film disposed on a substrate, wherein a plurality of openings is defined through the pixel defining film;

a plurality of light emitting elements disposed in the openings, respectively, wherein the light emitting elements emit light of different colors from each other;

a capping layer disposed on a common electrode of the light emitting elements;

an auxiliary layer disposed on the capping layer and including bismuth;

a thin film encapsulation layer including a first encapsulation layer disposed on the auxiliary layer, a second encapsulation layer disposed on the first encapsulation layer, and a third encapsulation layer disposed on the second encapsulation layer;

a light blocking layer disposed on the thin film encapsulation layer, wherein a plurality of opening holes is defined through the light blocking layer to overlap the openings, respectively; and an antireflection layer disposed on the light blocking layer, wherein the first encapsulation layer includes:

a first inorganic insulating layer disposed on the auxiliary layer and including silicon oxynitride;

a second inorganic insulating layer disposed on the first inorganic insulating layer and including silicon oxynitride; and a third inorganic insulating layer disposed on the second inorganic insulating layer and including silicon oxynitride, the capping layer has a thickness in a range of about 200 Å to about 300 Å, the auxiliary layer has a thickness in a range of about 80 Å to about 100 Å, the first inorganic insulating layer has a thickness in a range of about 1700 Å to about 1800 Å, the second inorganic insulating layer has a thickness in a range of about 1100 Å to about 1200 Å, the third inorganic insulating layer has a thickness of about 4000 Å or greater, and a first opening interval between a first opening of the openings, in which a first light emitting element of the light emitting elements which emits light of a first color is disposed, and a first opening hole of the opening holes overlapping the first opening is greater than a second opening interval between a second opening of the openings, in which a second light emitting element of the light emitting elements which emits light of a second color different from the first color is disposed, and a second opening hole of the opening holes overlapping the second opening.

14. The electronic device of claim 13, wherein the capping layer has a refractive index in a range of about 1.60 to about 2.30, the auxiliary layer has a refractive index which is about 2.0 or greater and greater than the refractive index of the capping layer, the first inorganic insulating layer has a refractive index in a range of about 1.70 to about 2.0, the second inorganic insulating layer has a refractive index in a range of about 1.20 to about 1.62, and the third inorganic insulating layer has a refractive index in a range of about 1.48 to about 1.89 and greater than the refractive index of the second inorganic insulating layer.

15. The electronic device of claim 13, wherein the first opening interval is about 5.72 μm, and the second opening interval is about 4.72 μm or less.

* * * * *